US012666984B2

(12) United States Patent
Yamano

(10) Patent No.: US 12,666,984 B2
(45) Date of Patent: Jun. 23, 2026

(54) SEMICONDUCTOR APPARATUS

(71) Applicant: FUJI ELECTRIC CO., LTD.,
Kawasaki (JP)

(72) Inventor: Akio Yamano, Frankfurt am Main (DE)

(73) Assignee: FUJI ELECTRIC CO., LTD.,
Kawasaki (JP)

( * ) Notice: Subject to any disclaimer, the term of this
patent is extended or adjusted under 35
U.S.C. 154(b) by 431 days.

(21) Appl. No.: 18/325,508

(22) Filed: May 30, 2023

(65) Prior Publication Data

US 2023/0307348 A1      Sep. 28, 2023

Related U.S. Application Data

(63) Continuation of application No.
PCT/JP2022/021068, filed on May 23, 2022.

(30) Foreign Application Priority Data

Jun. 4, 2021      (JP) ................................. 2021-094169

(51) Int. Cl.
*H10W 70/65*          (2026.01)
*H10W 44/00*          (2026.01)
(Continued)

(52) U.S. Cl.
CPC ......... *H10W 70/65* (2026.01); *H10W 44/401*
(2026.01); *H10W 90/00* (2026.01);
(Continued)

(58) Field of Classification Search
CPC . H01L 23/49838; H01L 23/647; H01L 24/32;
H01L 24/48; H01L 24/73;
(Continued)

(56) References Cited

U.S. PATENT DOCUMENTS 6,236,110 B1 *    5/2001    Muto ...................... H01L 24/48
257/784
2014/0001482 A1    1/2014    Hatsukawa
(Continued)

FOREIGN PATENT DOCUMENTS

JP          201411225 A      1/2014
JP          2018186302 A      11/2018
(Continued)

OTHER PUBLICATIONS

International Search Report for PCT/JP2022/021068 dated Aug. 9,
2022.
(Continued)

*Primary Examiner* — Teresa M. Arroyo

(57) ABSTRACT

A first conductive pattern includes a first input region
overlapping a first semiconductor device and a second input
region overlapping a second semiconductor device. An
output electrode of the first semiconductor device and an
output electrode of the second semiconductor device are
connected with each other by a first wiring member. The
output electrode of the second semiconductor device and a
second conductive pattern are connected with each other by
a second wiring member. A ratio of a current flowing from
the second input region to the second conductive pattern via
the second semiconductor device, relative to a current flow-
(Continued)

ing from the first input region to the second conductive pattern via the first semiconductor device, is equal to or greater than 0.90 and equal to or less than 1.10.

22 Claims, 10 Drawing Sheets

(51) Int. Cl.
   *H10W 72/00*        (2026.01)
   *H10W 90/00*        (2026.01)

(52) U.S. Cl.
   CPC ........ *H10W 72/884* (2026.01); *H10W 90/736* (2026.01); *H10W 90/753* (2026.01); *H10W 90/755* (2026.01)

(58) Field of Classification Search
   CPC ......... H01L 25/072; H01L 2224/32245; H01L 2224/48137; H01L 2224/48175; H01L 2224/73265; H01L 2924/13055; H01L 23/3735; H01L 23/49811; H01L 23/5386; H01L 2224/0603; H01L 2224/32225; H01L 2224/48139; H01L 2224/48227; H01L 2224/49111; H01L 2224/49175; H02M 7/003
   See application file for complete search history.

(56)                    References Cited

U.S. PATENT DOCUMENTS

| | | | |
|---|---|---|---|
| 2015/0155797 A1 | 6/2015 | Okayama | |
| 2016/0308038 A1* | 10/2016 | Sato ..................... H10D 12/481 | |
| 2019/0198495 A1 | 6/2019 | Fujita et al. | |
| 2020/0185359 A1 | 6/2020 | Nakashima et al. | |
| 2020/0395343 A1 | 12/2020 | Kakefu et al. | |
| 2021/0118837 A1* | 4/2021 | Takahashi ............... H01L 23/24 | |
| 2021/0288020 A1* | 9/2021 | Terashima .............. H01L 24/48 | |

FOREIGN PATENT DOCUMENTS

| | | |
|---|---|---|
| JP | 2019114727 A | 7/2019 |
| WO | 2013179547 A1 | 12/2013 |
| WO | 2019044748 A1 | 3/2019 |
| WO | 2020059285 A1 | 3/2020 |

OTHER PUBLICATIONS

Written Opinion of the International Searching Authority (WO/ISA) for PCT/JP2022/021068 dated Aug. 9, 2022.

* cited by examiner

SEMICONDUCTOR APPARATUS

CROSS REFERENCE TO RELATED APPLICATIONS

This application is a Continuation application of PCT Application No. PCT/JP2022/021068, filed on May 23, 2022, and is based on and claims priority from Japanese Patent Application No. 2021-094169, filed on Jun. 4, 2021, the entire contents of each of which are incorporated herein by reference.

BACKGROUND OF THE INVENTION

Field of the Invention

The present disclosure relates to a semiconductor apparatus.

Description of Related Art

In related art, a technique has been developed in which in order to reduce a size and to obtain a large current in a semiconductor apparatus, semiconductor devices are arranged on a conductive pattern with a high area efficiency. For example, WO 2019/044748 discloses an arrangement in which a conductive pattern on an insulation substrate and semiconductor devices are aligned in one direction. In the semiconductor device, a first main electrode is formed on a back surface opposed to the insulation substrate, and a second main electrode is formed on a front surface. The second main electrodes of the semiconductor devices are connected together by stitch bonding of wires. The second main electrodes of the semiconductor devices and the conductive pattern are connected together by further stitch bonding of wires, which connect the second main electrodes of the semiconductor devices together, to the conductive pattern.

In the above-described related art, because wires which connect second main electrodes with a conductive pattern do not have to be individually provided for semiconductor devices, a mountable area of the semiconductor devices becomes large, and a large capacity of a semiconductor apparatus is realized. On the other hand, a resistance value in a path from the second main electrode of each of the semiconductor devices to the conductive pattern becomes non-uniform, and a current which flows through each of the semiconductor devices becomes non-uniform. Accordingly, a temperature of a wire joining portion becomes relatively high in the semiconductor device in which the current is relatively large, a power cycle tolerance (the number of destruction cycles by repetition of turning ON and OFF of a predetermined current), a short-circuit tolerance, an $I^2t$ tolerance, and so forth, of the semiconductor device are reduced. As a result, there is a possibility that long-term reliability of the semiconductor apparatus cannot be maintained.

SUMMARY

To solve the above problems, a semiconductor apparatus of the present disclosure includes: a conductive pattern having a first conductive pattern and a second conductive pattern; and a first semiconductor device and a second semiconductor device each arranged on the first conductive pattern, the first conductive pattern includes a first input region overlapping the first semiconductor device and a second input region overlapping the second semiconductor device, each of the first semiconductor device and the second semiconductor device includes: a first main electrode that is provided on a first main surface opposed to the first conductive pattern and is electrically connected with the first conductive pattern; and a second main electrode that is provided on a second main surface on an opposite side to the first main surface, the second main electrode of the first semiconductor device and the second main electrode of the second semiconductor device are connected to each other by a first wiring member formed with a wire or a ribbon cable, the second main electrode of the second semiconductor device and the second conductive pattern are connected with each other by a second wiring member formed with a wire or a ribbon cable, and a ratio (i2/i1) of a current (i2) flowing from the second input region to the second conductive pattern via the second semiconductor device, relative to a current (i1) flowing from the first input region to the second conductive pattern via the first semiconductor device, is equal to or greater than 0.90 and equal to or less than 1.10.

Furthermore, a semiconductor apparatus of the present disclosure includes: a conductive pattern having a first conductive pattern and a second conductive pattern; and a first semiconductor device and a second semiconductor device each arranged on the first conductive pattern, the first conductive pattern includes a first input region overlapping the first semiconductor device and a second input region overlapping the second semiconductor device, each of the first semiconductor device and the second semiconductor device includes: a first main electrode that is provided on a first main surface opposed to the first conductive pattern and is electrically connected with the first conductive pattern; and a second main electrode that is provided on a second main surface on an opposite side to the first main surface, the second main electrode of the first semiconductor device and the second main electrode of the second semiconductor device are connected with each other by a first wiring member formed with a wire or a ribbon cable, the second main electrode of the second semiconductor device and the second conductive pattern are connected with each other by a second wiring member formed with the wire or the ribbon cable, and a ratio (R1/R2) of a resistance (R1) of a first path relative to a resistance (R2) of a second path is equal to or greater than 0.90 and equal to or less than 1.10, the first path starting from the first input region and reaching a connection point between the second main electrode of the second semiconductor device and the second wiring member while passing through the first semiconductor device and the first wiring member, and the second path starting from the second input region and reaching the connection point between the second main electrode of the second semiconductor device and the second wiring member while passing through the second semiconductor device.

BRIEF DESCRIPTION OF THE DRAWINGS

FIG. 5 is a cross-sectional view in which a region Z in the cross-sectional view of the semiconductor unit illustrated in FIG. 3 is enlarged.

FIG. 6 is a cross-sectional view in which the region Z in the cross-sectional view of the semiconductor unit illustrated in FIG. 3 is enlarged.

FIG. 7 is a cross-sectional view in which the region Z in the cross-sectional view of the semiconductor unit illustrated in FIG. 3 is enlarged.

DESCRIPTION OF THE EMBODIMENTS

Figure 1:
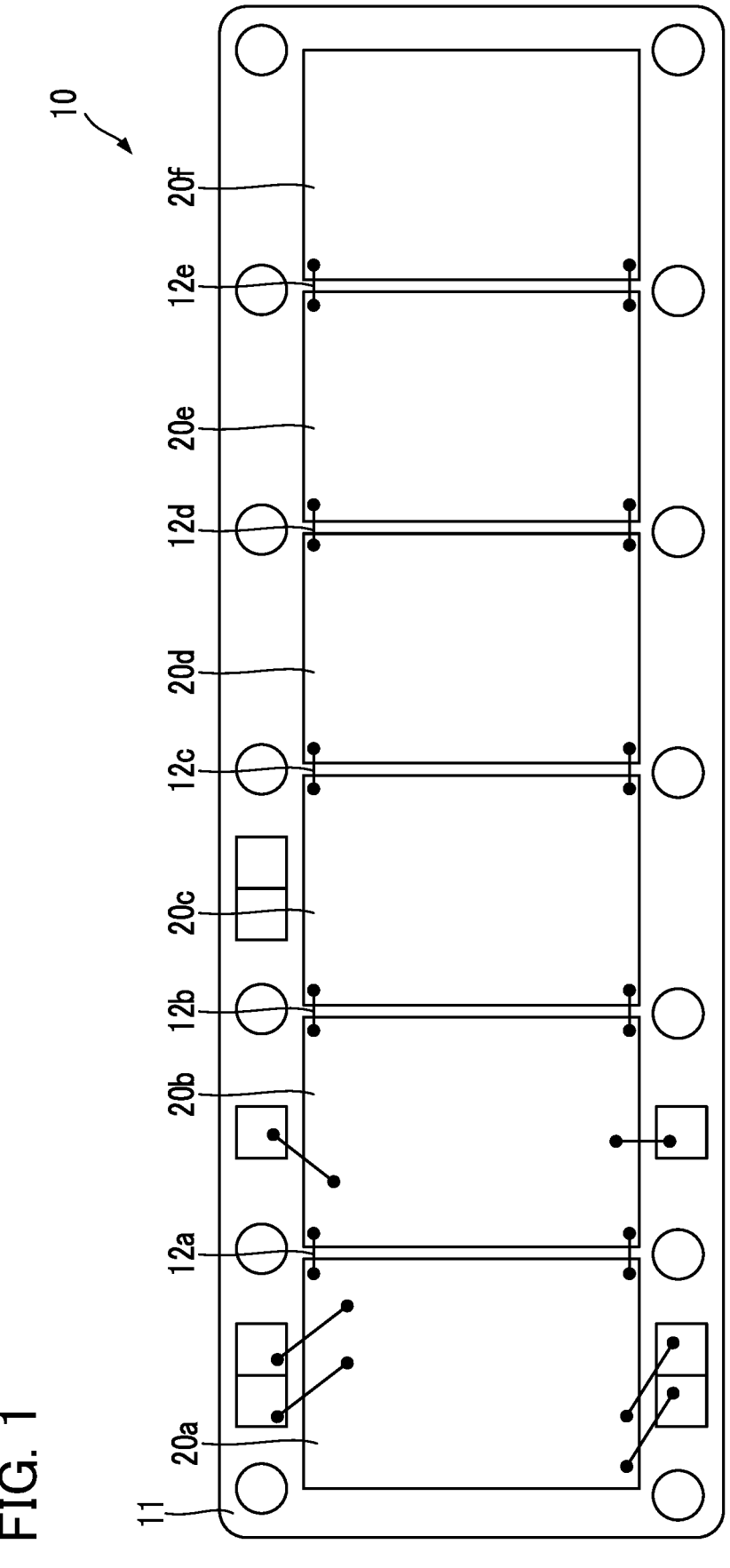
FIG. 1 is a plan view of a semiconductor apparatus 10 according to an embodiment.

In the following, an embodiment according to the present disclosure will be described with reference to the drawings. It is to be noted that in the drawings, dimensions and scale of each part are appropriately different from actual dimensions and scale. Furthermore, the embodiment described in the following is a preferable specific example of the present disclosure. Thus, various limitations which are technically preferable are applied to the following embodiment. However, the scope of the present disclosure is not limited by these forms unless descriptions to limit the present disclosure are particularly given in the following description.

FIG. 1 is a plan view of a semiconductor apparatus 10 according to the embodiment. The semiconductor apparatus 10 has a heat dissipation substrate 11 and semiconductor units 20a to 20f that are electrically connected together by bonding wires 12a to 12e. The heat dissipation substrate 11 is made of, for example, aluminum, iron, silver, or copper, which have excellent thermal conductivity, or an alloy including at least one of these. Furthermore, in order to improve corrosion resistance, a surface of the heat dissipation substrate 11 may be plated or the like, with a material, such as nickel. As the material to be used for the plating or the like, a nickel-phosphorus alloy, a nickel-boron alloy, or the like may be used instead of nickel. In the heat dissipation substrate 11, attachment holes used for attachment to an external apparatus, contact regions for inputting and outputting a current to and from the semiconductor units 20a to 20f, and so forth, are appropriately formed.

The semiconductor units 20a to 20f are arranged in one line on a front surface of the heat dissipation substrate 11 via solder, silver solder, or the like. Semiconductor devices (for example, semiconductor devices 25 to 28 which will be described later) are arranged on each of the semiconductor units 20a to 20f, and the semiconductor units 20a to 20f realize needed functions. It is to be noted that the number of semiconductor units 20a to 20f which is indicated in FIG. 1 is one example, but a necessary number of semiconductor units can be installed. Furthermore, in the following, the semiconductor units 20a to 20f will be referred to as a semiconductor unit in general, and details thereof will be described later. It is to be noted that the bonding wires 12a to 12e are formed of metal such as aluminum or copper, which has excellent electrical conductivity, an alloy including at least one type of these, or the like.

Figure 2:
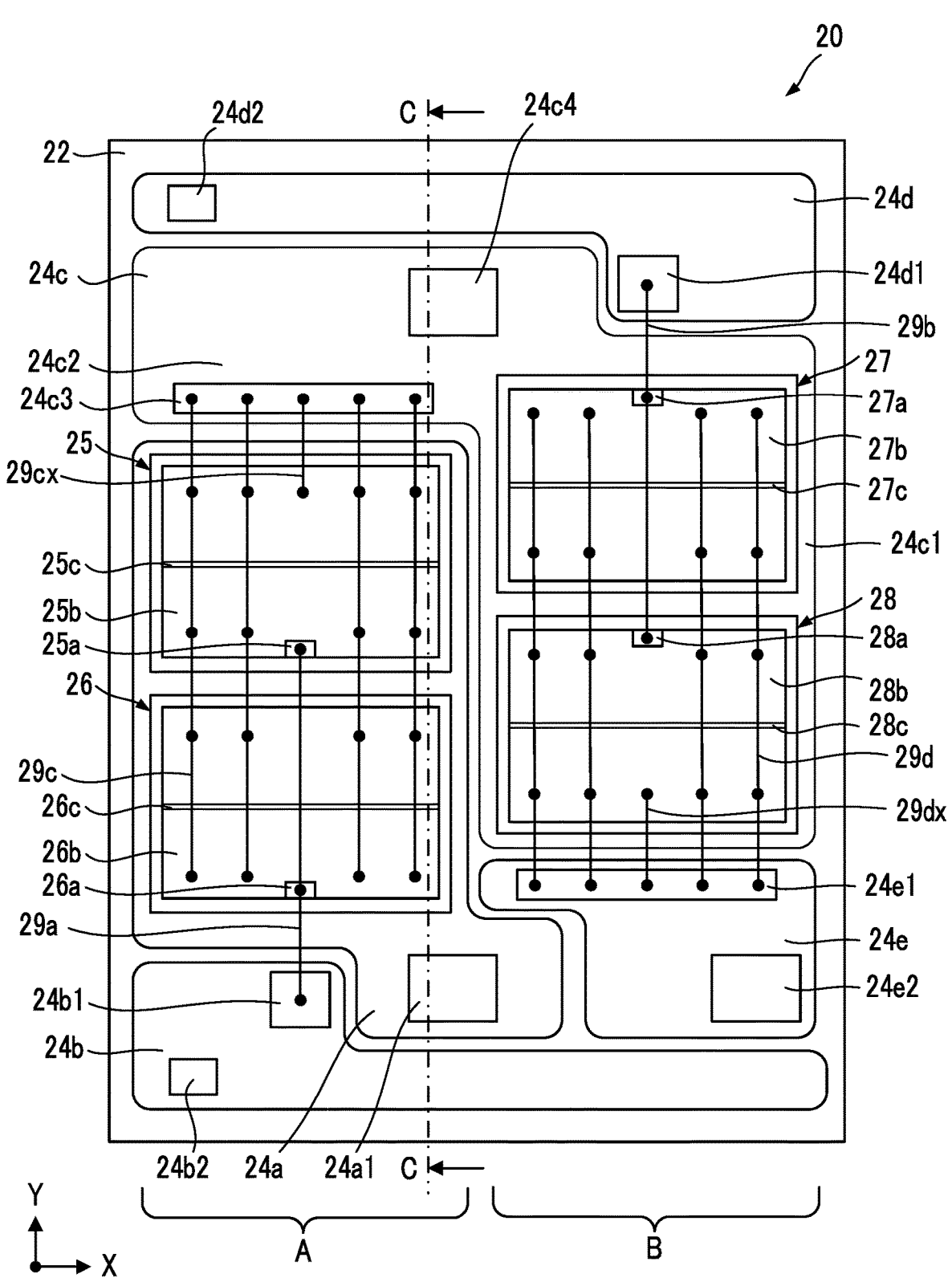
FIG. 2 is a plan view of a semiconductor unit 20 according to the embodiment.

Next, a configuration of the semiconductor unit 20 will be described with reference to FIG. 2 to FIG. 4. FIG. 2 is a plan view of the semiconductor unit 20 according to the embodiment, and FIG. 3 is a cross-sectional view of the semiconductor unit 20 according to the embodiment.

Figure 3:
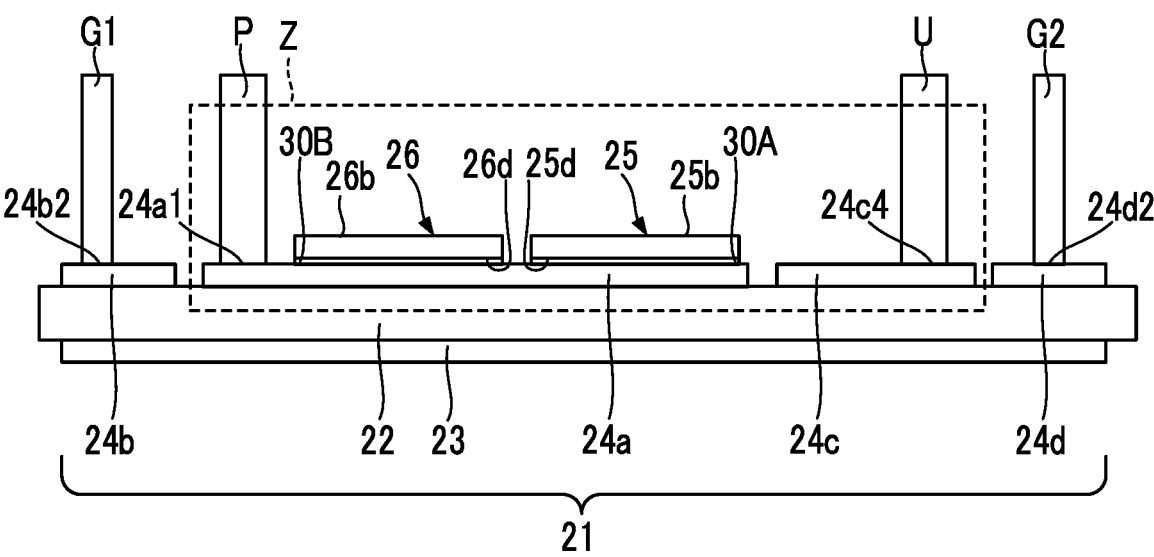
FIG. 3 is a cross-sectional view of the semiconductor unit 20 according to the embodiment.

It is to be noted that FIG. 3 illustrates a cross section taken along a one-dot chain line C-C in FIG. 2. However, FIG. 3 does not illustrate bonding wires 29. Furthermore, FIG. 4 is a circuit diagram of a circuit configured with the semiconductor unit 20 according to the embodiment.

In the present embodiment, the semiconductor unit 20 has a rectangular shape in plan view. More specifically, an insulation substrate 22 that constitutes the semiconductor unit 20 presents a rectangular shape with a pair of long sides opposed to each other and a pair of short sides opposed to each other in plan view, and the other components of the semiconductor unit 20 are arranged on the main surfaces (front surface and back surface) of the insulation substrate 22. In the present embodiment, an X axis is placed along the short side of the semiconductor unit 20 in plan view, and a Y axis is placed along the long side. The Y axis is one example of a first axis. It is to be noted that in the present embodiment, a plan view has the same meaning as viewing a target object in a vertical direction to the front surface of the insulation substrate 22.

The semiconductor unit 20 includes a first arm portion (upper arm portion) A and a second arm portion (lower arm portion) B, and upper and lower arm portions are formed. As illustrated in FIG. 4, an external connection terminal P (input P) that is connected with a positive electrode of an external power source (not illustrated) is connected with the first arm portion A, and the first arm portion A constitutes a circuit that supplies a current from the positive electrode (high potential terminal) of the external power source to a load. It is to be noted that the load is connected with an external connection terminal U (output U). An external connection terminal N (input N) that is connected with a negative electrode of the external power source is connected with the second arm portion B, and the second arm portion B constitutes a circuit that draws a current from the load to the negative electrode (low potential terminal) of the external power source. As illustrated in FIG. 2 and FIG. 3, the semiconductor unit 20 has a circuit substrate 21, and the semiconductor devices 25 to 28 which are provided on a front surface of the circuit substrate 21. The semiconductor devices 26 and 27 each are an example of a "first semiconductor device", and the semiconductor devices 25 and 28 each are an example of a "second semiconductor device". A back surface of the circuit substrate 21 is joined to the heat dissipation substrate 11 via solder, silver solder, or the like (not illustrated), and the semiconductor unit 20 is thereby arranged on the heat dissipation substrate 11 (see FIG. 1).

In the present embodiment, each of the semiconductor devices 25 to 28 includes silicon or silicon carbide and is a switching element of an RC-IGBT (reverse conducting insulated gate bipolar transistor) that includes an IGBT (insulated gate bipolar transistor) and an FWD (freewheeling diode) that are configured in one chip. An RC-IGBT has a circuit in which an IGBT and an FWD are connected together anti-parallel.

In the present embodiment, each of the semiconductor devices 25 to 28 has a rectangular shape in plan view. More specifically, when viewed in plan view, each of front surface and back surface of each of the semiconductor devices 25 to 28 presents a rectangular shape with a pair of long sides opposed to each other and a pair of short sides opposed to each other. Each of the semiconductor devices 25 to 28 is arranged such that its long sides extend along the X axis and its short sides extend along the Y axis.

For example, the semiconductor devices 25 to 28 each include an input electrode (collector electrodes, for example, an input electrode 25d of the semiconductor device 25 and an input electrode 26d of the semiconductor device 26 are illustrated in FIG. 3) as a first main electrode on the back surface (first main surface). Furthermore, the semiconductor devices 25 to 28 include, on the respective front surface (second main surface), control electrodes, i.e., gate electrodes 25a to 28a, respectively, and output electrodes, i.e., emitter electrodes 25b to 28b, respectively. An output electrode is a second main electrode. The gate electrodes 25a to 28a each are positioned adjacent to one of the long sides of the front surface of the corresponding semiconductor device 25 to 28 and around the center of the long side. Furthermore, the output electrodes 25b to 28b each are formed in a portion other than the corresponding gate electrode 25a to 28a of the front surface of the corresponding semiconductor device 25 to 28. Furthermore, gate runners 25c to 28c are each provided on the front surface of the corresponding semiconductor device 25 to 28. The gate runners 25c to 28c are electrically connected with the gate electrodes 25a to 28a, respectively. The gate runners 25c to 28c are provided to transmit a gate control signal supplied to the corresponding gate electrode 25a to 28a throughout the corresponding semiconductor device 25 to 28 without delay. In the present embodiment, the gate runners 25c to 28c each are arranged in parallel with the long sides of the corresponding semiconductor device 25 to 28 around the center of the short sides of the corresponding semiconductor device 25 to 28.

The circuit substrate 21 has the insulation substrate 22, and a metal plate 23 that is joined to the back surface of the insulation substrate 22. The insulation substrate 22 is formed of ceramic with high thermal conductivity, such as aluminum oxide, aluminum nitride, or silicon nitride, which has excellent thermal conductivity. The metal plate 23 is formed of metal having excellent thermal conductivity, such as aluminum, iron, silver, copper or an alloy including at least one of these. In addition, the circuit substrate 21 has conductive patterns 24a to 24e, each of which is formed on the front surface of the insulation substrate 22. The conductive patterns 24a to 24e are formed of metal such as copper or a copper alloy, which has excellent electrical conductivity. In order to improve corrosion resistance, for example, a plating using a material such as nickel may be applied to surfaces of the conductive patterns 24a to 24e. As the material other than nickel to be used for plating or the like, a nickel-phosphorus alloy, a nickel-boron alloy, or the like may be used. Furthermore, a thickness of each of the conductive patterns 24a to 24e is equal to or greater than 0.1 mm and equal to or less than 1 mm, for example. As the circuit substrate 21 having such a configuration, for example, a DCB (direct copper bonding) substrate or an AMB (active metal brazed) substrate can be used. The circuit substrate 21 can transmit heat produced in the semiconductor devices 25 to 28 to the heat dissipation substrate 11 via the conductive patterns 24a and 24c, the insulation substrate 22, and the metal plate 23. It is to be noted that the circuit substrate 21 may be a metal-based substrate or a lead frame in which a die pad is formed, for example.

The conductive pattern 24a comprises a collector pattern of the first arm portion A. The conductive pattern 24a is one example of a "first conductive pattern" in the first arm portion A. The collector pattern is a conductive pattern with which the input electrodes (collector electrodes) of the semiconductor devices (the semiconductor devices 25 and

26 in the first arm portion A) are connected. The conductive pattern 24a forms a generally rectangular shape, and a portion including a contact region 24a1 protrudes on a lower side in FIG. 2. As illustrated in FIG. 4 and so forth, the external connection terminal P to be connected with the positive electrode of the external power source is connected with the contact region 24a1. On the conductive pattern 24a, the semiconductor devices 25 and 26 are arranged at an interval along the Y axis. More specifically, each of the semiconductor devices 25 and 26 has a first long side and a second long side. The first long side of the semiconductor device 25 is arranged to be adjacent to the gate electrodes 25a and is arranged to be adjacent to a connection region 24b1 of the conductive pattern 24b, which will be described later. The first long side of the semiconductor device 26 is arranged to be adjacent to the gate electrode 26a and is arranged to be adjacent to the connection region 24b1. The second long side of the semiconductor device 25 is arranged in a position spaced away from the gate electrode 25a and is arranged to be adjacent to a connection region 24c3 of the conductive pattern 24c, which will be described later. The second long side of the semiconductor device 26 is arranged in a position spaced away from the gate electrode 26a and is arranged to be adjacent to the connection region 24c3. Consequently, the gate electrodes 25a and 26a are directed to the short side (on the lower side in FIG. 2) of the insulation substrate 22. The conductive pattern 24a and the semiconductor devices 25 and 26 are joined together via solder layers 30 (30A and 30B), respectively, and the collector electrodes which are formed on the respective back surfaces of the semiconductor devices 25 and 26 are electrically connected with the conductive pattern 24a.

It is to be noted that three or more semiconductor devices may be arranged on the first arm portion A. In such a case also, the semiconductor devices are arranged such that the gate electrodes are arrayed in one line while being directed to the connection region 24b1 of the conductive pattern 24b with which the gate electrodes are connected.

The conductive pattern 24b comprises a control pattern of the first arm portion A. The control pattern is a conductive pattern with which the control electrodes (gate electrodes) of the semiconductor devices (the semiconductor devices 25 and 26 in the first arm portion A) are connected. The conductive pattern 24b has the connection region 24b1 which is positioned on an extended line of the gate electrodes 25a and 26a of the semiconductor devices 25 and 26 which are aligned along the Y axis. A bonding wire 29a that is connected with the gate electrodes 25a and 26a of the semiconductor devices 25 and 26 is connected with the connection region 24b1. Furthermore, the conductive pattern 24b has a contact region 24b2 with which an external connection terminal G1 for the gate electrodes is connected. In FIG. 2, the conductive pattern 24b extends from a portion including the connection region 24b1 along the lower short side (X axis) of the insulation substrate 22 and vertically relative to an array of the semiconductor devices 25 and 26.

The conductive pattern 24c comprises an emitter pattern of the first arm portion A and a collector pattern of the second arm portion B. The conductive pattern 24c is one example of a "second conductive pattern" in the first arm portion A. Furthermore, the conductive pattern 24c is one example of the "first conductive pattern" in the second arm portion B. The emitter pattern is a conductive pattern with which the output electrodes (emitter electrodes) of the semiconductor devices (the semiconductor devices 25 and 26 in the first arm portion A) are connected. The conductive pattern 24c has a first region 24c1 that extends along the right long side of the insulation substrate 22 and has a generally rectangular shape, and a second region 24c2 that extends along the upper short side of the insulation substrate 22 and has a generally rectangular shape. The conductive pattern 24c presents a general L shape as a whole body.

The second region 24c2 comprises the emitter pattern of the first arm portion A. In the second region 24c2, the connection region 24c3 is provided on an extended line from the semiconductor devices 25 and 26 along the Y axis. Bonding wires 29c extending from the output electrodes 25b and 26b of the semiconductor devices 25 and 26 and a single-bonding wire 29cx extending from the output electrode 25b of the semiconductor device 25 are connected with the connection region 24c3. A contact region 24c4 is provided in the second region 24c2, and the external connection terminal U to be connected with the load is connected with the contact region 24c4.

The first region 24c1 comprises the collector pattern of the second arm portion B. On the first region 24c1, the semiconductor devices 27 and 28 are arranged at an interval along the Y axis. More specifically, each of the semiconductor devices 27 and 28 has a third long side and a fourth long side. The third long side of the semiconductor device 27 is arranged to be adjacent to the gate electrode 27a. The third long side of the semiconductor device 28 is arranged to be adjacent to the gate electrode 28a. The fourth long side of the semiconductor device 27 is arranged adjacent to a connection region 24d1 of a conductive pattern 24d described later and is spaced away from the gate electrode 27a. The fourth long side of the semiconductor device 28 is arranged adjacent to the connection region 24d1 and spaced away from the gate electrode 28a. Consequently, the gate electrodes 27a and 28a are directed to the short side (on an upper side in FIG. 2) of the insulation substrate 22. The first region 24c1 of the conductive pattern 24c and the semiconductor devices 27 and 28 are joined together via solder layers (not illustrated), and the collector electrodes formed on the back surfaces of the semiconductor devices 27 and 28 are electrically connected with the conductive pattern 24c.

It is to be noted that three or more semiconductor devices may be arranged on the second arm portion B. In such a case also, the semiconductor devices are arranged such that the gate electrodes are arrayed in one line while being directed to a connection region 24e1 of the conductive pattern 24e with which the gate electrodes are connected.

The conductive pattern 24d comprises a control pattern of the second arm portion B. The conductive pattern 24d has the connection region 24d1, and the connection region 24d1 is positioned on an extended line of the gate electrodes 27a and 28a of the semiconductor devices 27 and 28 aligned along the Y axis. Connected with the connection region 24d1 is a bonding wire 29b connected with the gate electrodes 27a and 28a of the semiconductor devices 27 and 28. Furthermore, the conductive pattern 24d has a contact region 24d2, and an external connection terminal G2 for the gate electrodes is connected with the contact region 24d2. In FIG. 2, the conductive pattern 24d extends from a portion including the connection region 24d1 along the upper short side (X axis) of the insulation substrate 22 and vertically to an array of the semiconductor devices 27 and 28.

The conductive pattern 24e comprises an emitter pattern of the second arm portion B. The conductive pattern 24e is one example of the "second conductive pattern" in the second arm portion B. In the conductive pattern 24e, the connection region 24e1 is provided on an extended line from the semiconductor devices 27 and 28 along the Y axis. Bonding wires 29d extending from the output electrodes 27b and 28b of the semiconductor devices 27 and 28 and a single-bonding wire 29dx extending from the output electrode 28b of the semiconductor device 28 are connected with the connection region 24e1. A contact region 24e2 is provided in the conductive pattern 24e, and an external connection terminal (not illustrated) is connected with the contact region 24e2. As illustrated in FIG. 4 and so forth, the external connection terminal N to be connected with the negative electrode of the external power source is connected with the contact region 24e2.

The bonding wires 29a to 29d (including the single-bonding wires 29cx and 29dx) are examples of wiring members that connect the semiconductor devices 25 to 28 with the conductive patterns 24. The bonding wires 29a to 29d are made of metal such as aluminum or copper, which has excellent electrical conductivity, or an alloy including at least one of these, or the like. Furthermore, it is preferable that a diameter of each of the bonding wires 29a to 29d be equal to or greater than 100 μm and equal to or less than 1 mm.

In the present embodiment, although a wire is used as the wiring member, a ribbon cable (ribbon wire) may be used as the wiring member. A wire is a linear member, and a current flows one-dimensionally in the wire. A ribbon cable is a belt-shaped member with a predetermined width, and a current flows two-dimensionally in the ribbon cable. It is to be noted that other than these, a lead frame has been known as a wiring member in a semiconductor apparatus. A lead frame is a plate-shaped member, and a current flows three-dimensionally in the lead frame. A lead frame has an advantage such as low resistance compared to a wire and a ribbon cable, but has difficulty in application to the present embodiment due to complication of processes in connecting with the semiconductor devices 25 to 28 or the conductive patterns 24. Thus, wires and ribbon cables are used as the wiring members in the present embodiment.

The bonding wire 29a is formed with a single wire stitch bonded to the gate electrode 25a of the semiconductor device 25, the gate electrode 26a of the semiconductor device 26, and the connection region 24b1. It is to be noted that, in stitch bonding, three or more points are bonded in such a manner that the points are successively connected by a single wire from first bonding to final bonding via bonding at one or more intermediate points. The bonding wire 29a is successively joined to the gate electrode 25a, the gate electrode 26a, and the connection region 24b1 and electrically connects these together. The bonding wire 29a functions as a gate wire through which a control current to the gate electrodes 25a and 26a flows. As illustrated in FIG. 2, the gate electrode 25a, the gate electrode 26a, and the connection region 24b1 are arranged in one line along the Y axis. Thus, the bonding wire 29a also extends along the Y axis.

The bonding wire 29b is formed with a single wire stitch bonded to the gate electrode 28a of the semiconductor device 28, the gate electrode 27a of the semiconductor device 27, and the connection region 24d1. The bonding wire 29b is successively joined to the gate electrode 28a, the gate electrode 27a, and the connection region 24d1 and electrically connects these together. The bonding wire 29b functions as a gate wire through which a control current to the gate electrodes 27a and 28a flows. As illustrated in FIG. 2, the gate electrode 28a, the gate electrode 27a, and the connection region 24d1 are arranged in one line along the Y axis. Thus, the bonding wire 29b also extends along the Y axis.

The bonding wire 29*c* electrically connects together the output electrode 25*b* of the semiconductor device 25, the output electrode 26*b* of the semiconductor device 26, and the conductive pattern 24*c*. The bonding wire 29*c* functions as an emitter wire through which an output current from the output electrodes (emitter electrodes) 25*b* and 26*b* flows. More specifically, one wire is stitch bonded to two points on the output electrode 26*b*, to two points on the output electrode 25*b*, and to one point on the connection region 24*c*3, a total of five points, and the bonding wire 29*c* is thereby formed. The points at which stitches are formed by stitch bonding (hereinafter, referred to as "stitch point") are aligned along the short sides of the semiconductor devices 25 and 26, that is, the Y axis, and the bonding wire 29*c* thus extends along the Y axis similarly to the bonding wire 29*a*. The stitch points in the output electrode 25*b* are respectively positioned on opposite sides of the gate runner 25*c*. The stitch points in the output electrode 26*b* are respectively positioned on opposite sides of the gate runner 26*c*.

Figure 5:
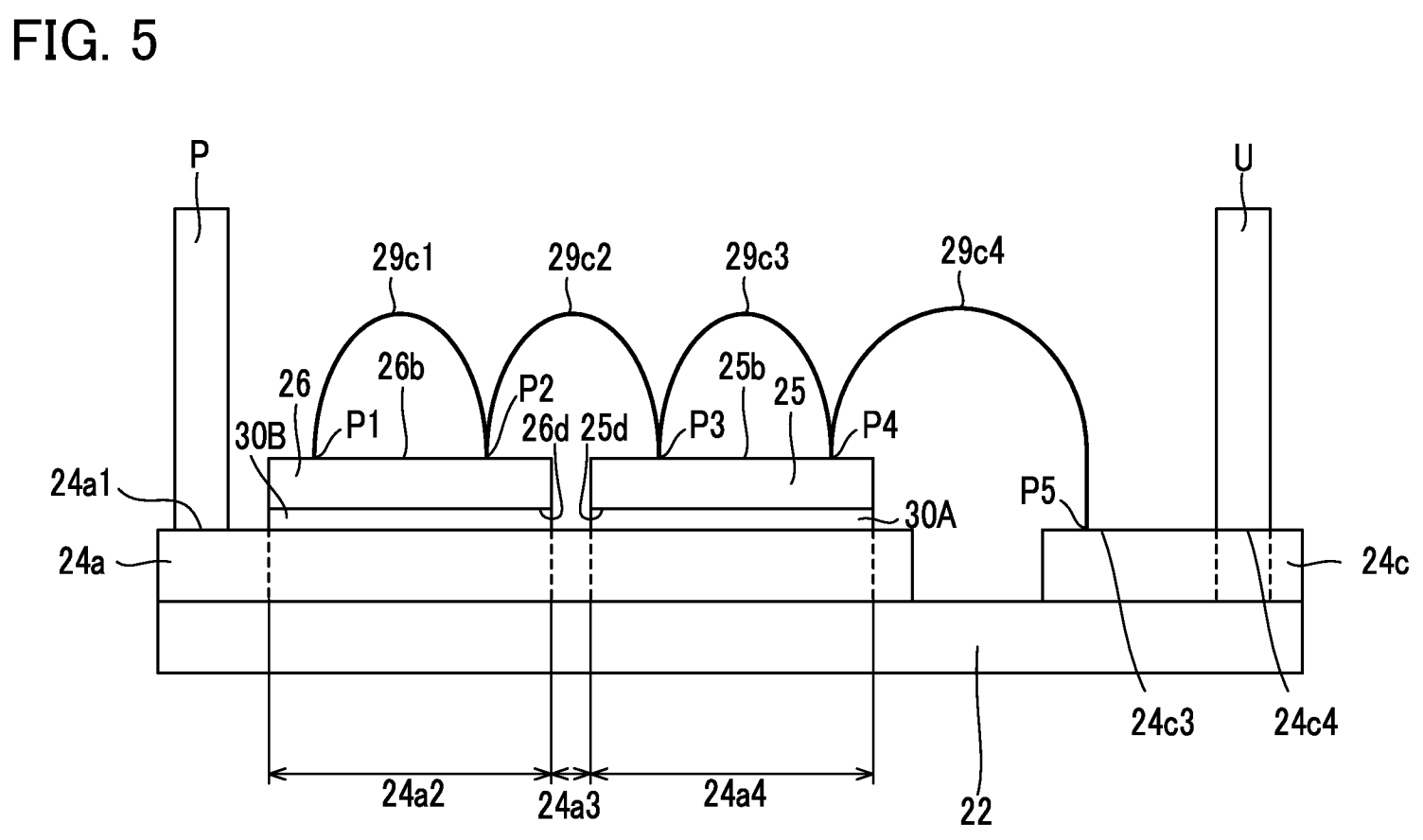

FIG. 5 is a cross-sectional view in which a region Z in the cross-sectional view of the semiconductor unit illustrated in FIG. 3 is enlarged. For example, as illustrated in FIG. 5, one bonding wire 29*c* has five bonding points and is demarcated into four partial wires 29*c*1 to 29*c*4 while having three stitch points among the five stitch points as boundaries. The partial wire 29*c*1 is a portion, in the bonding wire 29*c*, between a bonding point P1 on the output electrode 26*b* of the semiconductor device 26 and a stitch point P2 on the output electrode 26*b*, the stitch point P2 being spaced away from the bonding point P1 along the Y axis. The partial wire 29*c*2 is a portion, in the bonding wire 29*c*, between the stitch point P2 on the output electrode 26*b* of the semiconductor device 26 and a stitch point P3 on the output electrode 25*b* of the semiconductor device 25. The partial wire 29*c*2 is one example of a "first wiring member". The partial wire 29*c*3 is a portion, in the bonding wire 29*c*, between the stitch point P3 on the output electrode 25*b* of the semiconductor device 25 and a stitch point P4 on the output electrode 25*b*, the stitch point P4 being spaced away from the stitch point P3 along the Y axis. The partial wire 29*c*4 is a portion, in the bonding wire 29*c*, between the stitch point P4 on the output electrode 25*b* of the semiconductor device 25 and a bonding point P5 on the connection region 24*c*3 of the conductive pattern 24*c*. The partial wire 29*c*4 is one example of a "second wiring member". It is to be noted that FIG. 2 illustrates a case in which four bonding wires 29*c* are provided, but any number of bonding wires 29*c* may be used.

Furthermore, in FIGS. 2 and 5, stitch bonding is performed, by one wire (bonding wire 29*c*), to two points on the output electrode 26*b*, to two points on the output electrode 25*b*, and to one point on the connection region 24*c*3, a total of five points, but stitch bonding is not limited thereto. It is sufficient that stitch bonding be performed at one or more points on the output electrode 26*b*, one or more points on the output electrode 25*b*, and one or more points on the connection region 24*c*3. In this case also, the "first wiring member" may be a partial wire between a bonding point on the output electrode 26*b* which is closest to the output electrode 25*b* and a bonding point on the output electrode 25*b* which is closest to the output electrode 26*b*. Furthermore, the "second wiring member" may be a partial wire between a bonding point on the output electrode 25*b* which is closest to the conductive pattern 24*c* (connection region 24*c*3) and a bonding point on the connection region 24*c*3 which is closest to the output electrode 25*b*.

The bonding wire 29*d* electrically connects together the output electrode 27*b* of the semiconductor device 27, the output electrode 28*b*, and the conductive pattern 24*e*. The bonding wire 29*d* functions as an emitter wire through which an output current from the output electrodes (emitter electrodes) 27*b* and 28*b* flows. More specifically, one wire is stitch bonded to two points on the output electrode 27*b*, to two points on the output electrode 28*b*, and to one point on the connection region 24*e*1, a total of five points, and the bonding wire 29*d* is thereby formed. The stitch points are aligned along the short sides of the semiconductor devices 27 and 28, that is, the Y axis, and the bonding wire 29*d* thus extends along the Y axis similarly to the bonding wire 29*b*. The stitch points in the output electrode 27*b* are respectively positioned on opposite sides of the gate runner 27*c*. The stitch points in the output electrode 28*b* are respectively positioned on opposite sides of the gate runner 28*c*.

The single-bonding wire 29*cx* is joined to one point on the output electrode 25*b* of the semiconductor device 25 and one point on the connection region 24*c*3 of the conductive pattern 24*c* and electrically connects together the output electrode 25*b* and the conductive pattern 24*c*. The single-bonding wire 29*cx* is one example of a "third wiring member". The single-bonding wire 29*cx* functions as an emitter wire through which an output current from the output electrode (emitter electrode) 25*b* flows. The single-bonding wire 29*cx* is bonded to a position, in the output electrode 25*b*, on an opposite side of the gate runner 25*c* from the gate electrode 25*a* and is bonded to the connection region 24*c*3. The bonding points are arranged along the short side of the semiconductor device 25, that is, the Y axis, and the single-bonding wire 29*cx* thus extends along the Y axis similarly to the bonding wire 29*c*. FIG. 2 illustrates a case in which one single-bonding wire 29*cx* is provided, but two or more single-bonding wires 29*cx* may be provided.

The single-bonding wire 29*dx* is joined to one point on the output electrode 28*b* of the semiconductor device 28 and one point on the connection region 24*e*1 of the conductive pattern 24*e* and electrically connects together the output electrode 28*b* and the conductive pattern 24*e*. The single-bonding wire 29*dx* functions as an emitter wire through which an output current from the output electrode (emitter electrode) 28*b* flows. The single-bonding wire 29*dx* is bonded to a position, in the output electrode 28*b*, on an opposite side of the gate runner 28*c* from the gate electrode 28*a* and is bonded to the connection region 24*e*1. The bonding points are arranged along the short side of the semiconductor device 28, that is, the Y axis, and the single-bonding wire 29*dx* thus extends along the Y axis similarly to the bonding wire 29*d*. FIG. 2 illustrates a case in which one single-bonding wire 29*dx* is provided, but two or more single-bonding wires 29*dx* may be provided.

Figure 4:
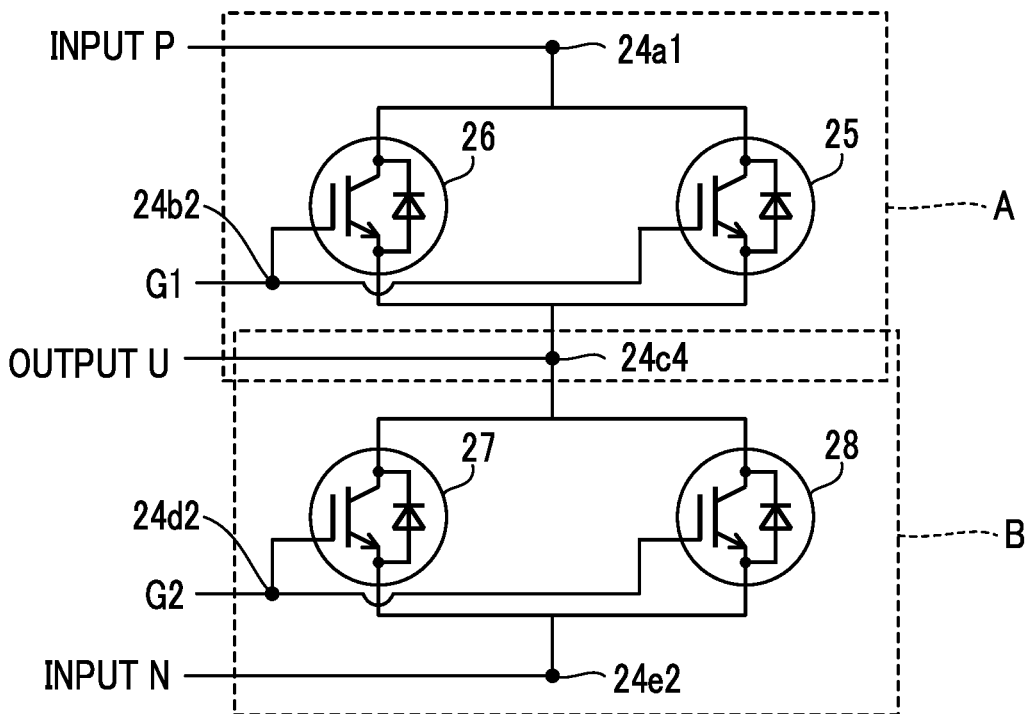
FIG. 4 is a circuit configuration diagram of a circuit configured with the semiconductor unit 20 according to the embodiment.

An inverter circuit illustrated in FIG. 4 is configured with the semiconductor devices 25 to 28, the conductive patterns 24*a* to 24*e*, the bonding wires 29*a*, 29*b*, 29*c*, and 29*d*, and the single-bonding wires 29*cx* and 29*dx*. The first arm portion (upper arm portion) A is configured with the semiconductor devices 25 and 26, the conductive patterns 24*a*, 24*b*, and 24*c*, and the bonding wires 29*a* and 29*c* (including the single-bonding wire 29*cx*). Furthermore, the second arm portion (lower arm portion) B is configured with the semiconductor devices 27 and 28, the conductive patterns 24*c*, 24*d*, and 24*e*, and the bonding wires 29*b* and 29*d* (including the single-bonding wire 29*dx*). Furthermore, in the semiconductor unit 20, the external connection terminal P to be connected with the positive electrode of the external power source is connected with the contact region 24*a*1, and the external connection terminal N to be connected with the negative electrode of the external power source is connected with the contact region 24e2. Furthermore, in the semiconductor unit 20, the external connection terminal U to be connected with the load on the outside of the semiconductor apparatus 10 is connected with the contact region 24c4. Accordingly, the semiconductor unit 20 functions as an inverter. In the semiconductor unit 20, for example, external connection terminals (not illustrated) are respectively joined to the contact regions 24a1, 24c4, and 24e2, and the semiconductor devices 25 to 28 and the bonding wires 29a to 29d on the circuit substrate 21 may be sealed by a sealing member. As the sealing member in this case, for example, a thermosetting resin such as a maleimide-modified epoxy resin, a maleimide-modified phenolic resin, or a maleimide resin can be used.

As described above, in the semiconductor unit 20 according to the present embodiment, the output electrode 25b of the semiconductor device 25, the output electrode 26b of the semiconductor device 26, and the connection region 24c3 of the conductive pattern 24c, which constitute the first arm portion A, are arranged to be aligned in one line. These are connected together by the bonding wires 29c, which are stitch bonded to the output electrode 26b, the output electrode 25b, and the connection region 24c3 of the conductive pattern 24c. That is, in the semiconductor apparatus 10, the semiconductor device 25 is arranged at an interval from the conductive pattern 24c along the Y axis, the semiconductor device 26 is arranged at an interval from the semiconductor device 25 along the Y axis, and the partial wire 29c2 and the partial wire 29c4 extend along the Y axis. Thus, the bonding wire 29c serves as both the emitter wire of the semiconductor device 25 and the emitter wire of the semiconductor device 26. Accordingly, compared to a case in which connection between the output electrode 25b of the semiconductor device 25 and the conductive pattern 24c and connection between the output electrode 26b of the semiconductor device 26 and the conductive pattern 24c are each made by separate wires, the connection region 24c3 can be reduced in size, and by the amount of reduction in size, mounting areas of the semiconductor devices 25 and 26 can be expanded.

Furthermore, in the present embodiment, the output electrode 25b of the semiconductor device 25, the output electrode 26b of the semiconductor device 26, and the connection region 24c3 of the conductive pattern 24c are connected together by stitch bonding of one bonding wire 29c. That is, in the semiconductor apparatus 10, the partial wire 29c2 and the partial wire 29c4 are formed with a single wire (bonding wire 29c) that is stitch bonded to the output electrode 26b of the semiconductor device 26, the output electrode 25b of the semiconductor device 25, and the conductive pattern 24c. Accordingly, the semiconductor devices 25 and 26 can simply be connected together, and manufacturing efficiency of the semiconductor apparatus 10 can be improved.

Furthermore, in the present embodiment, in addition to the bonding wires 29c, the single-bonding wire 29cx is provided which connects only the output electrode 25b of the semiconductor device 25 and the conductive pattern 24c together. That is, in the semiconductor apparatus 10, in addition to the bonding wires 29c including the partial wires 29c2 and the partial wires 29c4, the single-bonding wire 29cx is further provided which is a wire for connecting the output electrode 25b of the semiconductor device 25 and the conductive pattern 24c together. Accordingly, a part of a current that flows to the conductive pattern 24c via the semiconductor device 25 can be caused to flow through the single-bonding wire 29cx, and a temperature rise in joining portions of the partial wires 29c4 to the semiconductor device 25 can thereby be controlled.

Furthermore, in the present embodiment, each of the semiconductor devices 25 and 26 presents a rectangular shape in plan view, and the semiconductor devices 25 and 26 are arranged along the short sides of the rectangular shapes. That is, in the semiconductor apparatus 10, when viewed in plan view, each of the semiconductor device 26 and the semiconductor device 25 presents a rectangular shape which has a pair of long sides opposed to each other and a pair of short sides opposed to each other, and is arranged on the conductive pattern 24a such that the short sides are placed along the Y axis. As described above, the output electrode 25b of the semiconductor device 25, the output electrode 26b of the semiconductor device 26, and the connection region 24c3 of the conductive pattern 24c are arranged to be aligned in one line, and the bonding wires 29c are arranged therealong. Thus, the bonding wires 29c extend in parallel with the short sides of the semiconductor devices 25 and 26. Therefore, the bonding wires 29c can be arranged to be aligned along the long sides of the semiconductor devices 25 and 26, and it is possible to increase the number of the bonding wires 29c compared to a case in which the bonding wires 29c are arranged to be aligned along the short sides.

Furthermore, in the present embodiment, the gate runners 25c and 26c are provided on the respective front surfaces of the semiconductor devices 25 and 26, and the gate runner 25c is arranged in parallel with the long sides of the semiconductor device 25, and the gate runner 26c is arranged in parallel with the long sides of the semiconductor device 26. That is, in the semiconductor apparatus 10, the gate electrode 26a and the gate runner 26c electrically connected with the gate electrode 26a are provided to the output electrode 26b of the semiconductor device 26, the gate electrode 25a and the gate runner 25c electrically connected with the gate electrode 25a are provided to the output electrode 25b of the semiconductor device 25, and the gate runners 26c and 25c are arranged in parallel with the long sides of the front surfaces. The gate runner 25c is arranged in parallel with the long sides of the semiconductor device 25, the gate runner 26c is arranged in parallel with the long sides of the semiconductor device 26, and transmission delay of a control current to each portion of the semiconductor devices 25 and 26 can thereby be reduced. Furthermore, the gate runner 25c is arranged in parallel with the long sides of the semiconductor device 25, the gate runner 26c is arranged in parallel with the long sides of the semiconductor device 26, and wires can thereby efficiently be arranged when the bonding wires 29c are arranged to be aligned along the long sides of the semiconductor devices 25 and 26. It is to be noted that in the above, a description is made by taking the first arm portion A as an example, but the same applies to the second arm portion B.

Figure 8:
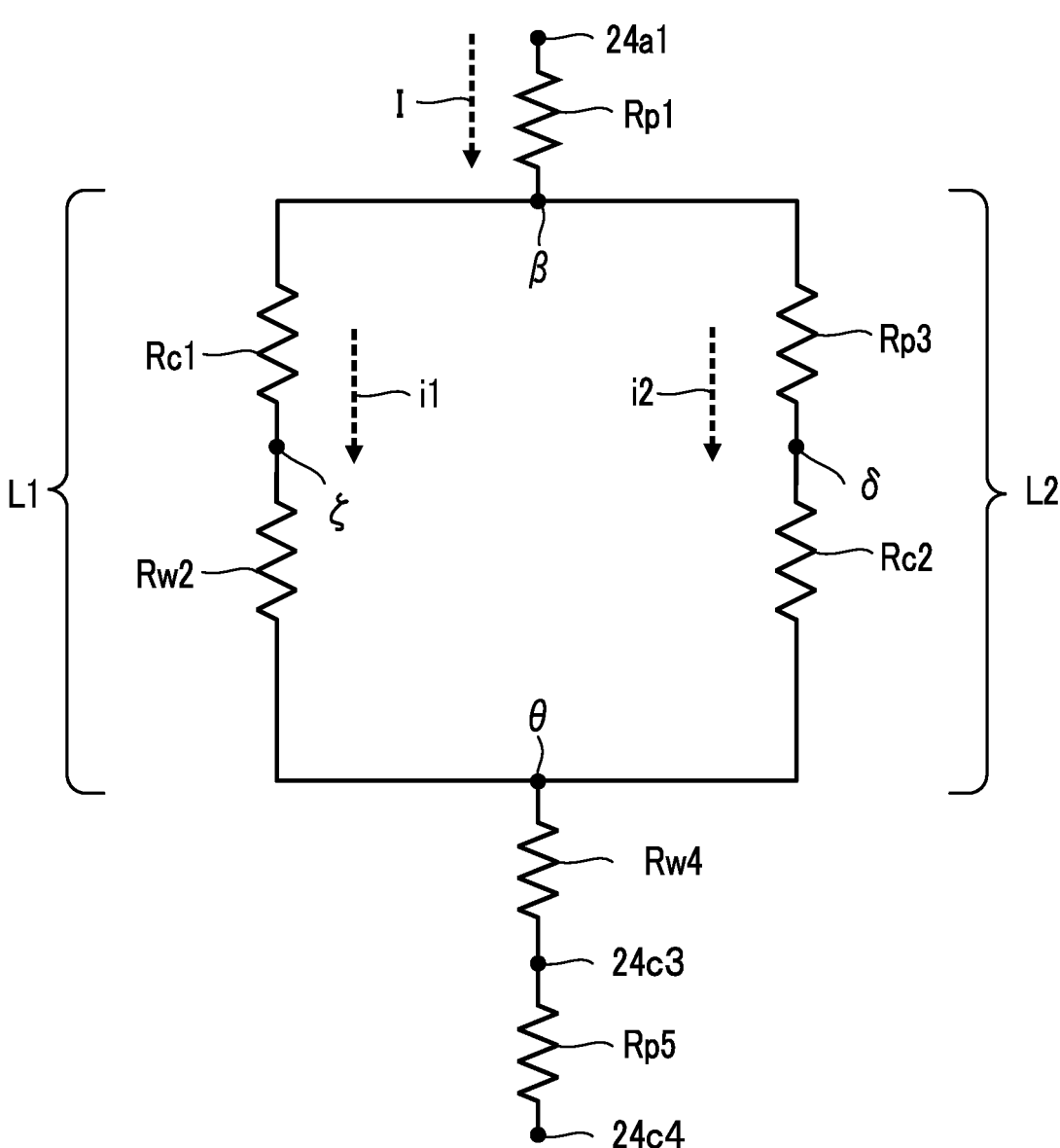
FIG. 8 is an equivalent circuit diagram of a configuration illustrated in FIG. 5.

Next, flow of a current in the semiconductor unit 20 will be described with reference to FIG. 6 to FIG. 8. In the following description, description will be made by taking flow of a current in the first arm portion A as an example, but the same applies to flow of a current in the second arm portion B.

Figure 6:
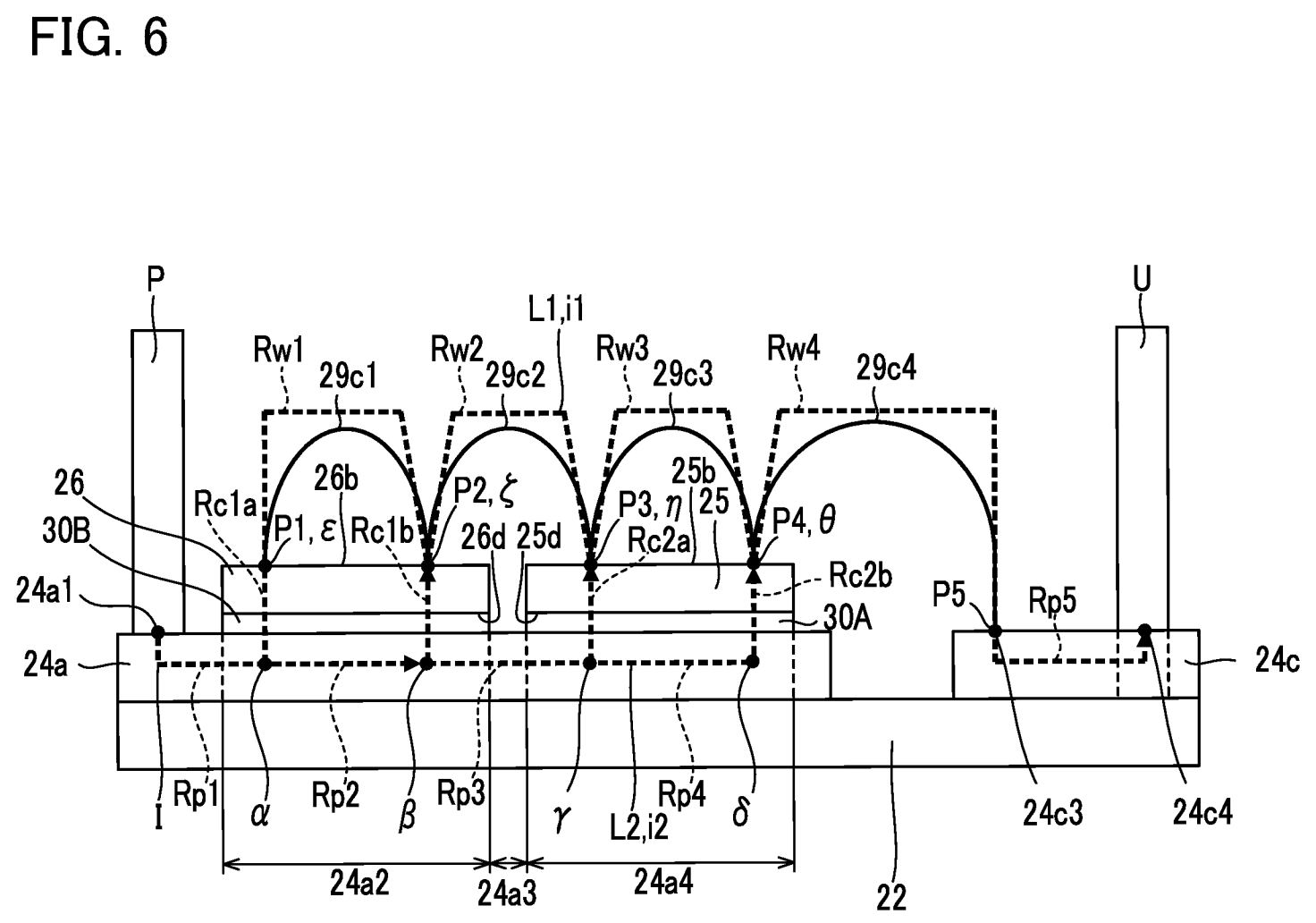

FIG. 6 is a diagram schematically illustrating flow of a current in the cross-sectional view in FIG. 5. FIG. 5 and FIG. 6 illustrate the insulation substrate 22, the conductive patterns 24a and 24c which are formed on the insulation substrate 22, the semiconductor devices 25 and 26 which are arranged on the conductive pattern 24a, the solder layer 30A which joins the semiconductor device 25 and the conductive pattern 24*a* together, the solder layer 30B which joins the semiconductor device 26 and the conductive pattern 24*a* together, and the bonding wire 29*c*. The solder layers 30A and 30B are examples of a "connection layer".

A current I that is input from the external connection terminal P to the contact region 24*a*1 of the conductive pattern 24*a* flows through the conductive pattern 24*a* and first reaches an input region 24*a*2. The input region 24*a*2 is a region, in the conductive pattern 24*a*, that overlaps the semiconductor device 26 present in a position relatively close to the contact region 24*a*1 (a position relatively far from the conductive pattern 24*c*). The input region 24*a*2 is one example of a "first input region". A current i1 is a part of the current I that reaches the input region 24*a*2, flows to the input electrode 26*d* of the semiconductor device 26 via the solder layer 30B and flows to the output electrode 26*b* of the semiconductor device 26. The current i1 further flows to the partial wire 29*c*2, which connects together the output electrode 26*b* and the output electrode 25*b* of the semiconductor device 25. It is to be noted that from the semiconductor device 26 to a connection point (the stitch point P2, a point ξ which will be described later) of the partial wire 29*c*2, the current i1 may flow through the partial wire 29*c*1, which connects together internal portions of the output electrode 26*b*. Subsequently, the current i1 passes through the partial wire 29*c*3 which connects together multiple points of the output electrode 25*b* and reaches a connection point (the stitch point P4, a point θ which will be described later) on the output electrode 25*b*, the connection point being closest to the conductive pattern 24*c* (connection region 24*c*3). It is to be noted that a part of the current i1 may flow in the output electrode 25*b* instead of the partial wire 29*c*3. Then, the current i1 is merged with a current i2 (described later) at the output electrode 25*b*, the merged current I passes through the partial wire 29*c*4, which connects together the output electrode 25*b* and the connection region 24*c*3 of the conductive pattern 24*c*, flows through the conductive pattern 24*c*, and reaches the contact region 24*c*4, which is connected with the external connection terminal U. Here, a flow path of the divided current i1 will be referred to as path L1. That is, the path L1 may range from the input region 24*a*2, via the semiconductor device 26, to the output electrode 25*b* of the semiconductor device 25. More specifically, the path L1 may range from the input region 24*a*2, via the solder layer 30B, a portion between the electrodes (the input electrode 26*d* and the output electrode 26*b*) of the semiconductor device 26, and the partial wire 29*c*2 which connects together the output electrode 26*b* of the semiconductor device 26 and the output electrode 25*b* of the semiconductor device 25, to the stitch point P4, which is the connection point on the output electrode 25*b* with the partial wire 29*c*4.

In the current I having reached the input region 24*a*2, the current i2 other than the current i1 to be supplied to the semiconductor device 26 reaches an input region 24*a*4 via an intermediate region 24*a*3. The input region 24*a*4 is one example of a "second input region". The input region 24*a*4 is a region, in the conductive pattern 24*a*, that overlaps the semiconductor device 25 present in a position relatively far from the contact region 24*a*1 (a position relatively close to the conductive pattern 24*c*). The intermediate region 24*a*3 is a region, of the conductive pattern 24*a*, between the input region 24*a*2 and the input region 24*a*4. The current i2 having reached the input region 24*a*4 flows to the input electrode 25*d* of the semiconductor device 25 via the solder layer 30A, flows to the output electrode 25*b* of the semiconductor device 25, and reaches the connection point (the stitch point P4, the point θ which will be described later) on the output electrode 25*b*, the connection point being closest to the conductive pattern 24*c* (connection region 24*c*3). It is to be noted that from the semiconductor device 25 to the stitch point P4 (the point θ described later), the current i2 may flow through the partial wire 29*c*3, which connects together internal portions of the output electrode 25*b*. Then, the current i2 is merged with the current i1 at the output electrode 25*b*. The merged current I passes through the partial wire 29*c*4 which connects together the output electrode 25*b* and the connection region 24*c*3 of the conductive pattern 24*c*, flows through the conductive pattern 24*c*, and reaches the contact region 24*c*4 which is connected with the external connection terminal U. Here, a flow path of the divided current i2 will be referred to as path L2. That is, the path L2 may range from the input region 24*a*2, via the semiconductor device 25, to the output electrode 25*b* of the semiconductor device 25. More specifically, the path L2 may range from the input region 24*a*2, via the intermediate region 24*a*3, the input region 24*a*4, the solder layer 30A, and a portion between the electrodes (the input electrode 25*d* and the output electrode 25*b*) of the semiconductor device 25, to the stitch point P4 as the connection point on the output electrode 25*b* with the partial wire 29*c*4.

In FIG. 6, a point α may be a point adjacent to the contact region 24*a*1, in the input region 24*a*2, and may approximately be provided directly below the bonding point P1. A point β may be a point adjacent to the intermediate region 24*a*3, in the input region 24*a*2, and may be provided approximately directly below the stitch point P2. A point γ may be a point adjacent to the intermediate region 24*a*3, in the input region 24*a*4, and may be provided approximately directly below the stitch point P3. A point δ may be a point adjacent to the conductive pattern 24*c*, in the input region 24*a*4, and may be provided approximately directly below the stitch point P4.

In FIG. 6, a point ε is a start point of the partial wire 29*c*1 and is the bonding point P1 in the present embodiment. The point ξ is an end point of the partial wire 29*c*1 and a start point of the partial wire 29*c*2 (the first wiring member) and is the stitch point P2 in the present embodiment. A point η is an end point of the partial wire 29*c*2 and a start point of the partial wire 29*c*3 and is the stitch point P3 in the present embodiment. The point θ is an end point of the partial wire 29*c*3 and a start point of the partial wire 29*c*4 (the second wiring member) and is the stitch point P4 in the present embodiment.

The above point α to point θ are respective conceptual points about which resistances in the input electrodes 25*d* and 26*d* and in the output electrodes 25*b* and 26*b* of the semiconductor devices 25 and 26 are ignored.

A resistance between the contact region 24*a*1 and the point α is set as a resistance Rp1. A resistance between the point α and the point β is set as a resistance Rp2. A resistance between the point β and the point γ is set as a resistance Rp3. A resistance between the point γ and the point δ is set as a resistance Rp4. Consequently, the resistances Rp1 to Rp4 may be resistances in the conductive pattern 24*a*. A resistance between the point α and the point δ is set as a resistance Rc1*a*. A resistance between the point β and the point ξ is set as a resistance Rc1*b*. Consequently, the resistances Rc1*a* and Rc1*b* may be a resistance between the electrodes (a resistance between the input electrode 26*d* and the output electrode 26*b*) of the semiconductor device 26 and a resistance of the solder layer 30B between the semiconductor device 26 and the conductive pattern 24*a*. A resistance between the point γ and the point η is set as a resistance Rc2*a*. A resistance between the point δ and the point θ is set as a resistance Rc2*b*. Consequently, the resistances Rc2*a* and Rc2*b* may be a resistance between the electrodes (a resistance between the input electrode 25*d* and the output electrode 25*b*) of the semiconductor device 25 and a resistance of the solder layer 30A between the semiconductor device 25 and the conductive pattern 24*a*. A resistance between the point ε and the point ξ is set as a resistance Rw1. A resistance between the point ξ and the point η is set as a resistance Rw2. A resistance between the point η and the point θ is set as a resistance Rw3. A resistance between the point θ and a point P5 is set as a resistance Rw4. Consequently, the resistances Rw1 to Rw4 may be resistances in the partial wires 29*c*1 to 29*c*4.

Here, when non-uniformity of a current that flows through the semiconductor devices 25 and 26 is discussed, resistances related to wiring in the same semiconductor devices, specifically, the resistances Rw1, Rp2, Rw3, and Rp4 can be ignored. This is because the resistances related to the wiring in the same semiconductor devices hardly contribute to non-uniformity of a current between the semiconductor devices. Furthermore, the resistances Rc1*a* and Rc1*b*, which are the resistance between the electrodes of the same semiconductor device 25 and the resistance of the solder layer 30A, can be considered to be the same. Thus, the resistances Rc1*a* and Rc1*b* are set as a resistance Rc1. Furthermore, the resistances Rc2*a* and Rc2*b*, which are the resistance between the electrodes of the same semiconductor device 26 and the resistance of the solder layer 30B, can be considered to be the same. Thus, the resistances Rc2*a* and Rc2*b* are set as a resistance Rc2.

Figure 7:
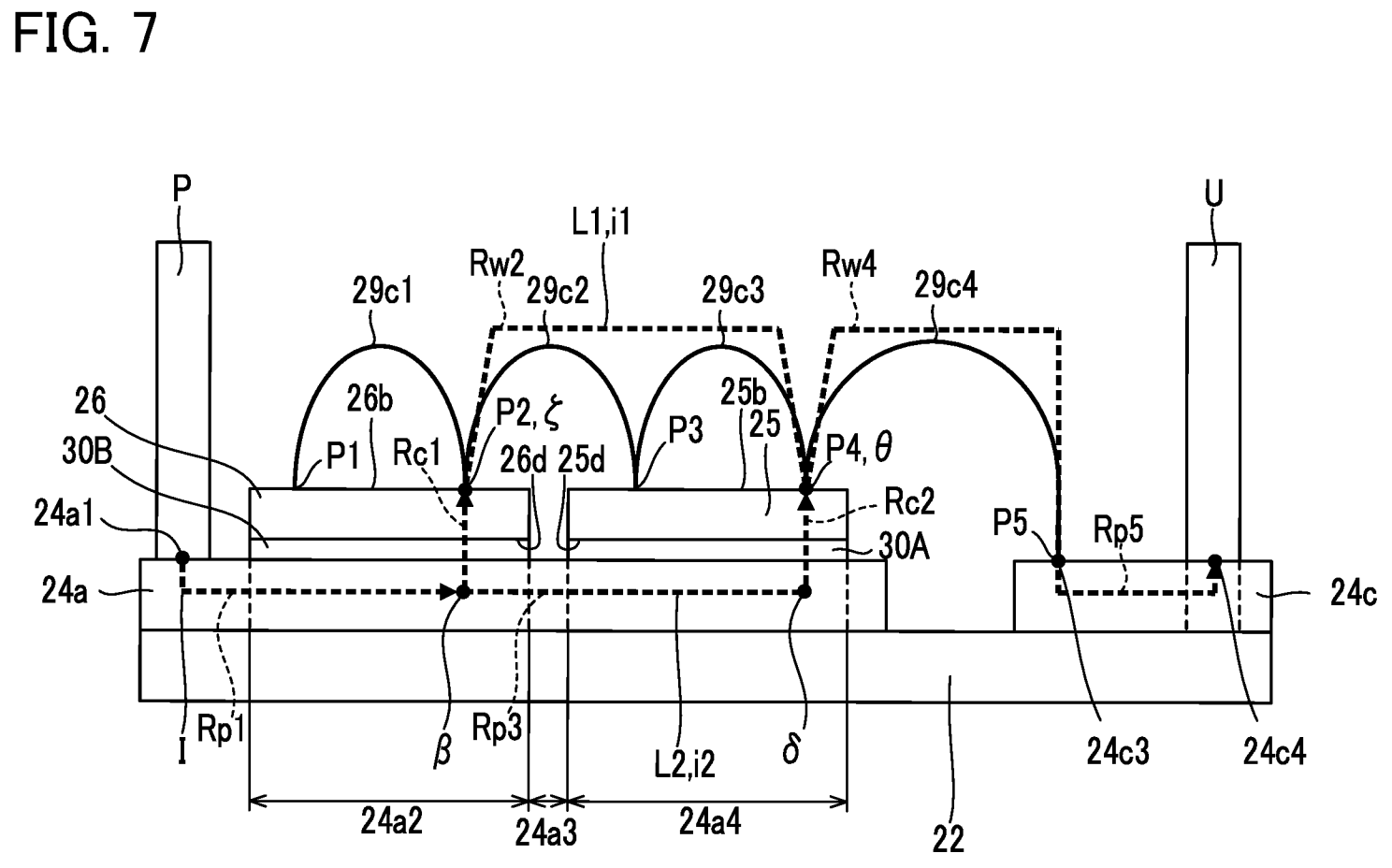

FIG. 7 is a diagram which results from removal of the resistances related to the wiring in the same semiconductor devices from FIG. 6. Furthermore, FIG. 8 is an equivalent circuit diagram of FIG. 7. As described above, in the first arm portion A, there flows the current i1 flowing through the path L1, which starts from the input region 24*a*2, passes through the semiconductor device 26, and reaches the stitch point P4, and the current i2 flowing through the path L2, which starts from the input region 24*a*4, passes through the semiconductor device 25, and reaches the stitch point P4. Referring to FIG. 7 and FIG. 8, on the path L1, the resistance Rc1 and the resistance Rw2 are present. The resistance Rc1 and the resistance Rw2 contribute to non-uniformity of a current in the semiconductor devices 25 and 26. Furthermore, on the path L2, the resistance Rp3 and the resistance Rc2 are present. The resistance Rp3 and the resistance Rc2 contribute to non-uniformity of a current in the semiconductor devices 25 and 26. Thus, by Ohm's law and so forth, a ratio i2/i1 of the current i2 flowing through the path L2 relative to the current i1 flowing through the path L1 can be expressed by the following Formula (1).

$$\frac{i2}{i1} = \frac{Rc1 + Rw2}{Rc2 + Rp3} \tag{1}$$

In the above Formula (1), the resistance Rc1 includes the resistance between the electrodes (the resistance between the input electrode 26*d* and the output electrode 26*b*) of the semiconductor device 26 and the resistance of the solder layer 30B. The resistance Rw2 includes a resistance of the partial wire 29*c*2, which is the first wiring member. The resistance Rc2 includes the resistance between the electrodes (the resistance between the input electrode 25*d* and the output electrode 25*b*) of the semiconductor device 25 and the resistance of the solder layer 30A. The resistance Rp3 includes a resistance of the intermediate region 24*a*3.

In general, a resistivity of the bonding wire 29*c* is high compared to a resistivity of the conductive pattern 24*a*. Furthermore, when it is assumed that the semiconductor devices 25 and 26 are elements of the same type to which properties such as materials or structures are the same, the resistance Rc1 is equivalent to the resistance Rc2. Thus, in general design, the current i2 which flows through the path L2 is large compared to the current i1 which flows through the path L1 (current i1<current i2). When such non-uniformity of a current occurs, in the semiconductor device in which a flowing current is relatively large (the semiconductor device 25 in the present embodiment), a temperature of a portion in which the semiconductor device and the wire are joined together (hereinafter, referred to as "wire joining portion") becomes relatively high, a power cycle tolerance, a short-circuit tolerance, an I²t tolerance, and so forth of the semiconductor device are reduced as a result, and furthermore, there is a possibility that long-term reliability of the semiconductor apparatus 10 cannot be maintained.

Here, a range of the current will be discussed that allows for prevention or reduction in lowering of various tolerances of the semiconductor devices 25 and 26. As described above, lowering of various tolerances of the semiconductor devices 25 and 26 occurs due to a temperature rise in the wire joining portion. It is preferable that a temperature difference between the wire bonding portions in the semiconductor devices 25 and 26 fall within 20° C. That is, when between the semiconductor devices 25 and 26 which are connected in parallel, a temperature rise in the wire joining portion in the semiconductor device through which a larger current flows is set as T2 and a temperature rise in the semiconductor device through which a smaller current flows is set as T1, it is preferable that T2−T1=ΔT≤20° C. hold true. In this case, for example, in a case of T1=100° C., T2 has to be limited to 120° C. or less (in other words, T2≤T1×1.20). A temperature rise of the wire is proportional to the square of a current. The square root of 1.20 is about 1.10. Thus, the current i2 in the semiconductor device in which the current is greater has to be limited to 110% or less (i2≤i1×1.10) relative to the current i1 in the semiconductor device in which the current is less. Accordingly, in the present embodiment, the ratio i2/i1 of the current i2 flowing through the path L2 relative to the current i1 flowing through the path L1 is set to a value which is equal to or greater than 0.90 and equal to or less than 1.10. For example, in the first arm portion A, the ratio i2/i1 of the current i2, which flows from the input region 24*a*4 to the conductive pattern 24*c* via the semiconductor device 25, relative to the current i1, which flows from the input region 24*a*2 to the conductive pattern 24*c* via the semiconductor device 26, is equal to or greater than 0.90 and equal to or less than 1.10.

Further preferably, it is preferable that the temperature difference between the wire bonding portions in the semiconductor devices 25 and 26 fall within 15° C. That is, it is preferable that T2−T1=ΔT≤15° C. hold true. In this case, for example, in a case of T1=100° C., T2 has to be limited to 115° C. or less (in other words, T2≤T1×1.15). The square root of 1.15 is about 1.07. Thus, in this case, the current i2 in the semiconductor device in which the current is greater has to be limited to 107% or less (i2≤i1×1.07) relative to the current i1 in the semiconductor device in which the current is less. That is, further preferably, the ratio i2/i1 of the current i2 flowing through the path L2 relative to the current i1 flowing through the path L1 is set to a value which is equal to or greater than 0.93 and equal to or less than 1.07.

Still further preferably, it is preferable that the temperature difference between the wire bonding portions in the semiconductor devices 25 and 26 fall within 10° C. That is, it is preferable that T2−T1=ΔT 10° C. hold true. In this case, for example, in a case of T1=100° C., T2 has to be limited to 110° C. or less (in other words, T2≤T1×1.10). The square root of 1.10 is about 1.05. Thus, in this case, the current i2 in the semiconductor device in which the current is greater has to be limited to 105% or less (i2≤i1×1.05) relative to the current i1 in the semiconductor device in which the current is less. That is, still further preferably, the ratio i2/i1 of the current i2 flowing through the path L2 relative to the current i1 flowing through the path L1 is set to a value which is equal to or greater than 0.95 and equal to or less than 1.05.

Furthermore, as described above, when a resistance of the path L1 is set as R1, R1=Rc1+Rw2 holds true. Furthermore, when a resistance of the path L2 is set as R2, R2=Rc2+Rp3 holds true. Thus, it can be considered that the above formula (1) represents a ratio R1/R2 of the resistance R1 of the path L1 relative to the resistance R2 of the path L2. That is, in the present embodiment, when the ratio R1/R2 of the resistance R1 of the path L1 relative to the resistance R2 of the path L2 is equal to or greater than 0.90 and equal to or less than 1.10, a similar effect can also be obtained.

In this case also, further preferably, it is desirable that the ratio R1/R2 of the resistance R1 relative to the resistance R2 be equal to or greater than 0.93 and equal to or less than 1.07. Still further preferably, it is desirable that the ratio R1/R2 of the resistance R1 relative to the resistance R2 be equal to or greater than 0.95 and equal to or less than 1.05.

In the present embodiment, values of parameters included in the above formula (1) are adjusted such that the current generally uniformly flows through the path L2 and the path L1. Specifically, the values of the parameters included in the above formula (1) are set such that the ratio i2/i1 of the current i2 flowing through the path L2 relative to the current i1 flowing through the path L1 becomes equal to or greater than 0.90 and equal to or less than 1.10. It is to be noted that, as described above, a further preferable ratio i2/i1 is equal to or greater than 0.93 and equal to or less than 1.07, and a still further preferable ratio i2/i1 is equal to or greater than 0.95 and equal to or less than 1.05.

In the following, methods of adjusting the values of the parameters included in the above formula (1) will be specifically described. As described above, because the resistivity of the bonding wire 29c is high compared to the resistivity of the conductive pattern 24a, in general design, the current i2 which flows through the path L2 is large compared to the current i1 which flows through the path L1 (current i1<current i2). Thus, in order to eliminate non-uniformity of the current, at least one of Method A for increasing the current i1 or Method B for decreasing the current i2 may be performed. It is to be noted that Method A and Method B may simultaneously be employed. That is, the current i1 may be increased, and the current i2 may be decreased.

Method A: Increasing Current i1

In order to increase the current i1, the resistance on the path L1 may be reduced. Specifically, at least one of Method A-1 for reducing the resistance Rc1 or Method A-2 for reducing the resistance Rw2 may be performed.

Method A-1: Reducing Resistance Rc1

The resistance Rc1 includes the sum of the resistance of the solder layer 30B and the resistance of the semiconductor device 26 (more specifically, the resistance between the electrodes of the semiconductor device 26). Thus, in order to reduce the resistance Rc1, for example, a configuration is possible in which the resistance of the semiconductor device 26 is made low compared to a resistance of the semiconductor device 25, or a configuration is possible in which the resistance of the solder layer 30B is made low compared to the resistance of the solder layer 30A.

Examples of methods for reducing the resistance Rc1 may include the following:

Example 1 As the semiconductor device 26, a low-speed type RC-IGBT is used in which conduction loss is small compared to the semiconductor device 25.

Example 2 As the semiconductor device 26, an RC-IGBT is used in which a saturation current density is high compared to the semiconductor device 25.

Example 3 As the semiconductor device 26, an RC-IGBT is used in which a threshold voltage Vth is small compared to the semiconductor device 25.

Example 4 A thickness of the solder layer 30B is made thinner than a thickness of the solder layer 30A.

Method A-2: Reducing Resistance Rw2

The resistance Rw2 includes the resistance of the partial wire 29c2, which is the first wiring member. In order to reduce the resistance Rw2, for example, a total cross-sectional area, i.e., the sum of cross-sectional areas of the bonding wires 29c, may be increased. In this case, when the resistance Rw2 is the same as the resistance Rp3 including the resistance of the intermediate region 24a3, the ratio i2/i1 will be one, and the current i2 will be equivalent to the current i1. It is to be noted that due to a factor such as a temperature, a value of resistance changes. Thus, the "same" in this case includes a case in which the resistances perfectly agree with each other and also a case in which the resistances substantially agree with each other. A case in which the resistances substantially agree with each other is a case such as one in which the resistances are predicted to be the same under a predetermined condition.

Examples of methods for reducing the resistance Rw2 may include the following:

Example 1 The number of bonding wires 29c is increased.

Example 2 A diameter of the bonding wire 29c is thickened.

Example 3 Instead of the wire, a ribbon cable formed of copper or the like is used as the wiring member.

Method B: Decreasing Current i2

In order to decrease the current i2, the resistance on the path L2 may be made higher. Specifically, at least one of Method B-1 for increasing the resistance Rp3 or Method B-2 for increasing the resistance Rc2 may be performed.

Method B-1: Increasing Resistance Rp3

The resistance Rp3 includes the resistance of the intermediate region 24a3. In order to increase the resistance Rp3, for example, a cross-sectional area of the intermediate region 24a3 may be decreased compared to the input region 24a2 which is present on an upstream side of the intermediate region 24a3.

Figure 9:
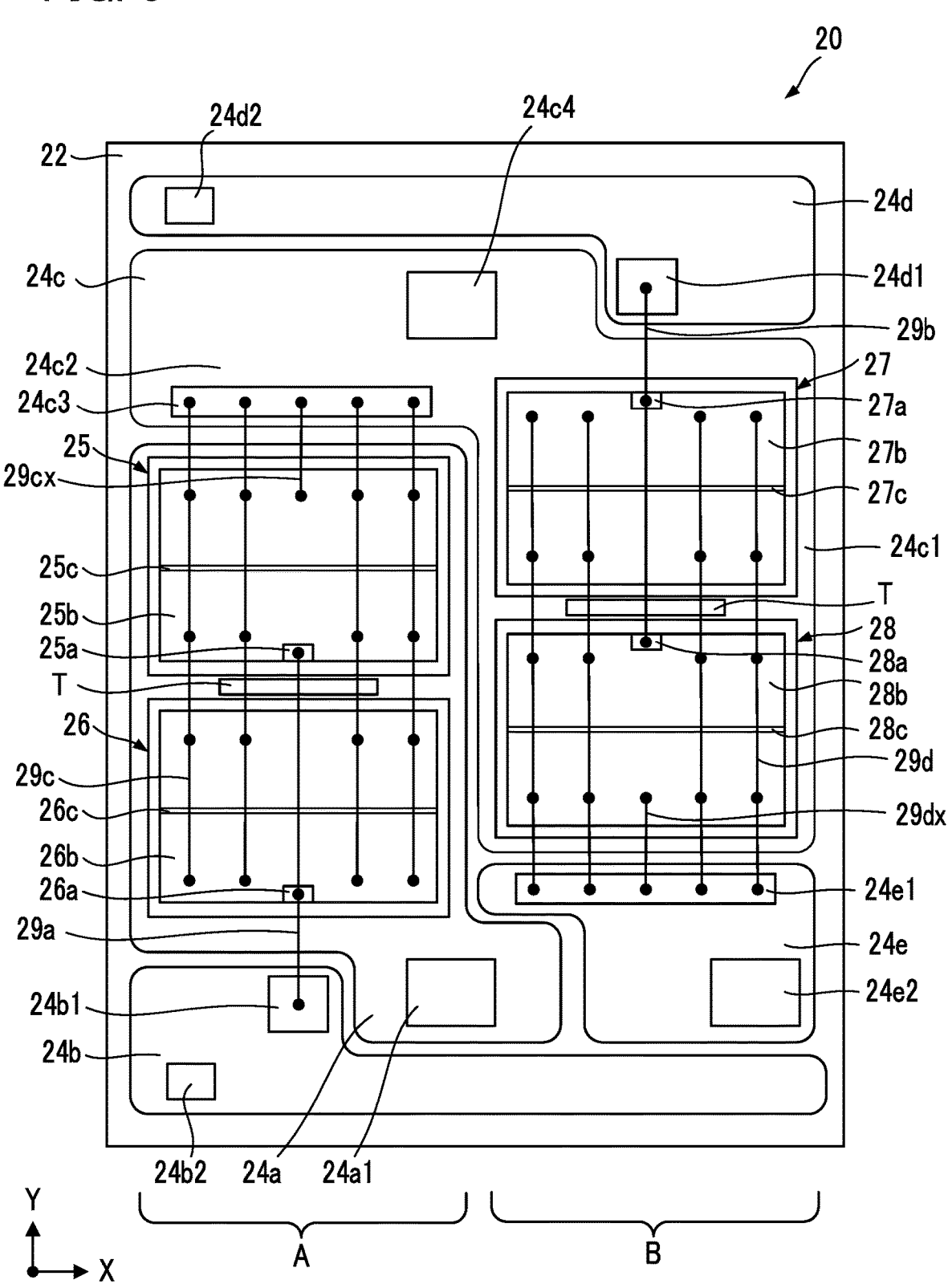
FIG. 9 is a plan view of the semiconductor apparatus 10 to which trenches T are provided.

Specifically, for example, as illustrated in FIG. 9, a trench T may be provided in which a part of the conductive pattern 24c of the intermediate region 24a3 is removed. That is, in Method B-1, in the intermediate region, a trench may be provided in which a part of the first conductive pattern is removed. The trench T illustrated in FIG. 9 is formed between the long sides of the adjacent semiconductor devices 25 and 26 and along the long sides. Because central portions in the semiconductor devices 25 and 26 are likely to produce heat, it is preferable that the trench T be formed around central portions of the long sides of the semiconductor devices 25 and 26. The trench T may be formed together when the conductive patterns 24a to 24e are formed, for example. That is, the conductive patterns 24a to 24e are formed by selective removal (for example, etching) of a metal layer formed on the insulation substrate 22. Specifically, etching is performed, with portions to become the conductive patterns 24a to 24e in the metal layer being masked, for example. In this process, the metal layer is removed by etching a region corresponding to the trench T without the region being masked, and the trench T can thereby be formed. In the trench T, the insulation substrate 22 may be exposed by complete removal of the metal layer, or the metal layer may be removed to the extent that a thickness is thin compared to other regions (for example, the input region 24a2) of the conductive pattern 24c.

Method B-2: Increasing Resistance Rc2

The resistance Rc2 includes the resistance of the solder layer 30A and the resistance of the semiconductor device 25. In order to increase the resistance Rc2, for example, a configuration is possible in which the resistance of the semiconductor device 25 is made high compared to the resistance of the semiconductor device 26, or a configuration is possible in which the resistance of the solder layer 30A is increased compared to the resistance of the solder layer 30B.

Examples of methods for increasing the resistance Rc2 may include the following:

Example 1 As the semiconductor device 25, a high-speed type RC-IGBT is used in which conduction loss is large compared to the semiconductor device 26.

Example 2 As the semiconductor device 25, an RC-IGBT is used in which the saturation current density is low compared to the semiconductor device 26.

Example 3 As the semiconductor device 25, an RC-IGBT is used in which the threshold voltage Vth is large compared to the semiconductor device 26.

Example 4 The thickness of the solder layer 30A is made thicker than the thickness of the solder layer 30B.

Next, a range of each parameter in the above formula (1) will be discussed. First, the resistances Rc1 and Rc2 will be discussed. The resistance Rc1 includes a resistance Re1 between the electrodes of the semiconductor device 26 and a resistance Rs1 of the solder layer 30B. The resistance Rc2 includes a resistance Re2 between the electrodes of the semiconductor device 25 and a resistance Rs2 of the solder layer 30A.

Figure 10:
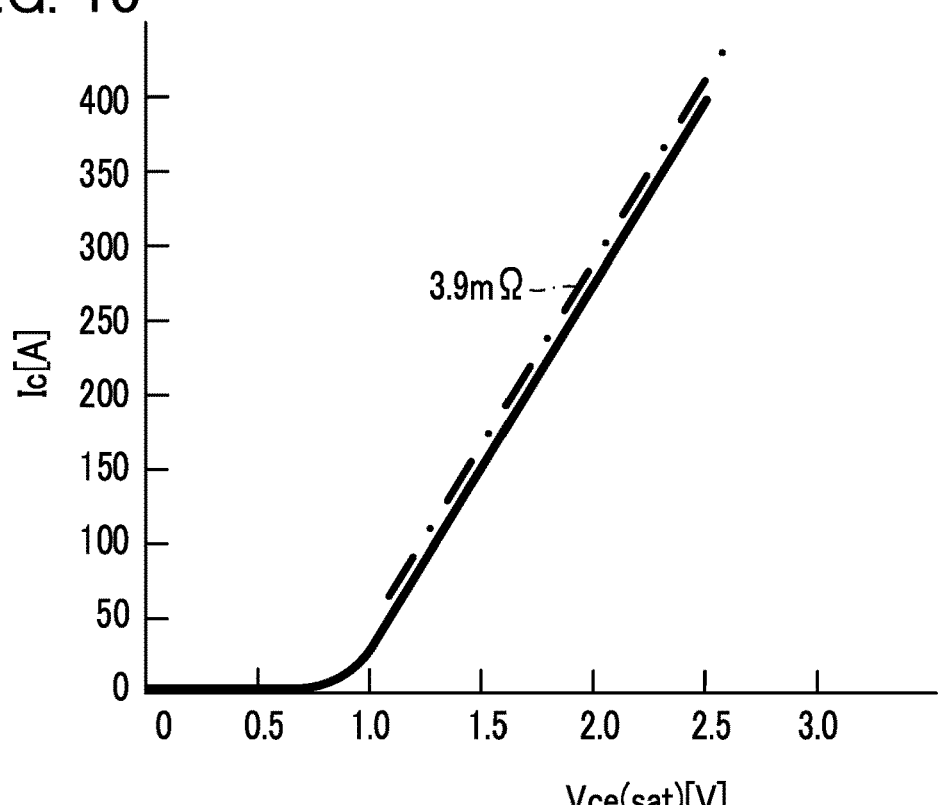
FIG. 10 is a graph representing one example of an I-V curve of the semiconductor device at room temperature.
Figure 11:
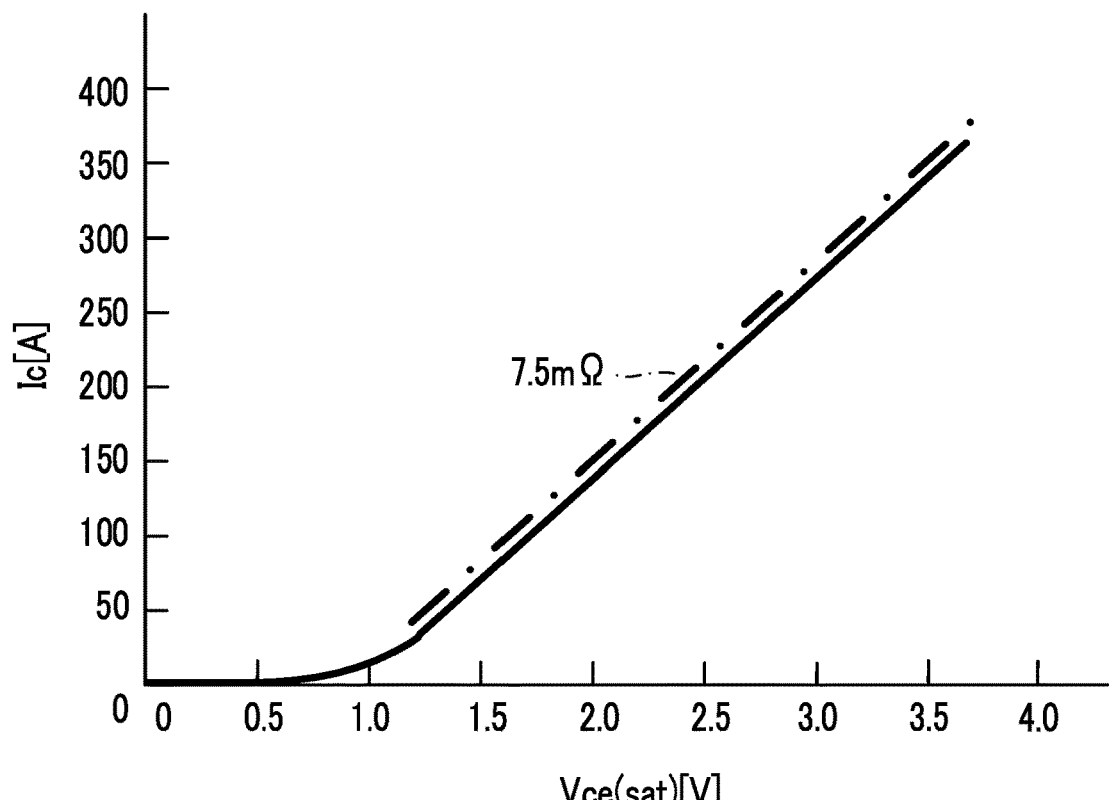
FIG. 11 is a graph representing one example of the I-V curve of the semiconductor device at 175° C.

FIG. 10 and FIG. 11 are graphs representing examples of I-V curves of the semiconductor device. FIG. 10 illustrates an I-V curve in a situation in which a device temperature is at room temperature (25° C.), and FIG. 11 illustrates an I-V curve at a device temperature of 175° C. In each of the graphs, the horizontal axis represents an applied voltage, and the vertical axis represents a current that flows through the semiconductor device. The semiconductor device used for measurement of the I-V curves is an RC-IGBT which is used for a semiconductor apparatus with a rated voltage of 1,700 V and a rated current of 2,200 A, a rated current of the semiconductor device is 183 A, and a chip size is 13.9 mm×13.5 mm Based on the I-V curves at an applied voltage of 1 V or greater, the resistance of this semiconductor device at room temperature is 3.9 mΩ, and the resistance at 175° C. is 7.5 mΩ. Thus, the resistance of this semiconductor device for 1 square centimeter is 2 mΩ/cm² at the room temperature and 4 mΩ/cm² at 175° C.

A current density of the semiconductor apparatus in which this semiconductor device is used is approximately 150 A/cm². Furthermore, in general, current densities of an IGBT and an FWD with rated voltages of 650 V to 3.3 kV are from 75 A/cm² to 450 A/cm². Thus, it is preferable that a resistance for 1 square centimeter of each of the semiconductor devices 25 to 28 to be used for the semiconductor apparatus 10 be in a range of 1 mΩ/cm² to 6 mΩ/cm² at room temperature and in a range of 2 mΩ/cm² to 12 mΩ/cm² at 175° C.

Next, the resistance Rw2 and the resistance Rp3 will be discussed. When the range (equal to or greater than 0.90 and equal to or less than 1.10) of the above ratio i2/i1 is applied to the above Formula (1), the following Formula (2) is provided.

$$0.90 \leq \frac{i2}{i1} = \frac{Rc1 + Rw2}{Rc2 + Rp3} \leq 1.10 \qquad (2)$$

In the above Formula (2), when it is assumed that the semiconductor devices 25 and 26 are of the same type and the thicknesses of the solder layers 30A and 30B are the same, Rc1=Rc2=R can be set. When Rw2=y and Rp3=x are set, the above Formula (2) becomes the following Formula (3).

$$0.90x - 0.10R \leq y \leq 1.10x + 0.10R \qquad (3)$$

Figure 12:
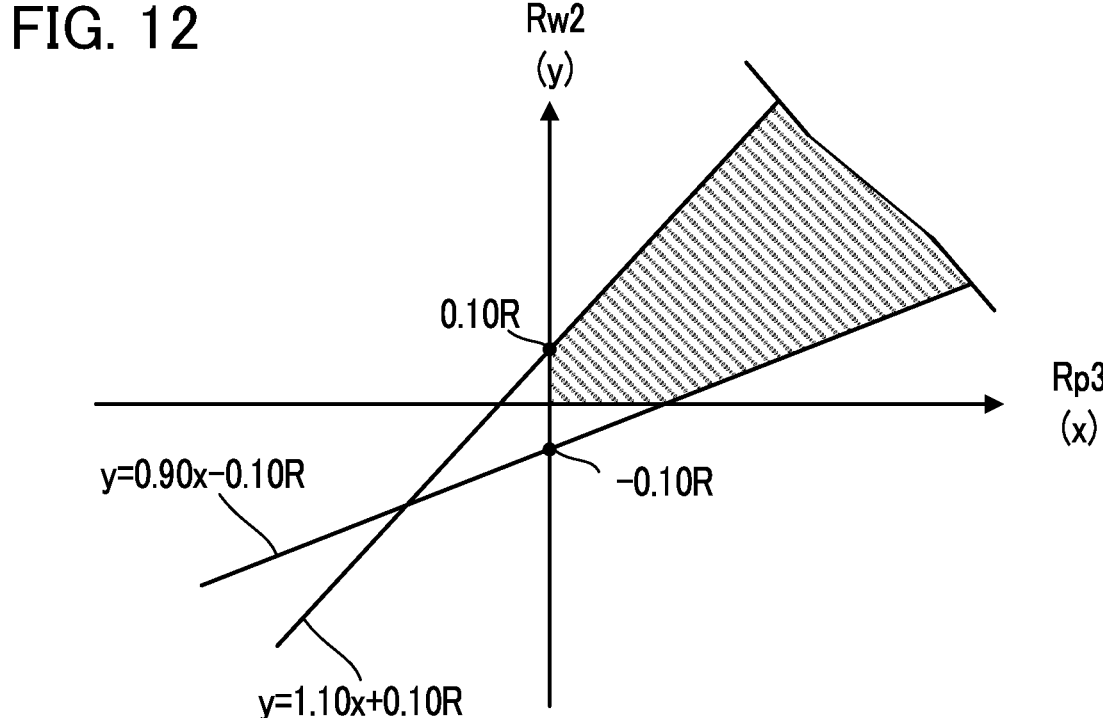
FIG. 12 is a graph representing a range of resistances Rw2 and Rp3.

FIG. 12 illustrates a graph of the above Formula (3). Because a resistance takes a positive value, when Rw2 and Rp3 are caused to fall in a hatched range in FIG. 12, the ratio i2/i1 of the current i2 relative to the current i1 becomes equal to or greater than 0.90 and equal to or less than 1.10.

It is to be noted that, as described above, a further preferable ratio i2/i1 is equal to or greater than 0.93 and equal to or less than 1.07. Thus, when Rc1=Rc2=R, Rw2=y, and Rp3=x are set, the further preferable range is expressed by the following Formula (4).

$$0.93x - 0.07R \leq y \leq 1.07x + 0.07R \qquad (4)$$

Furthermore, a still further preferable ratio i2/i1 is equal to or greater than 0.95 and equal to or less than 1.05. Thus, when Rc1=Rc2=R, Rw2=y, and Rp3=x are set, the still further preferable range is expressed by the following formula (5).

$$0.95x - 0.05R \leq y \leq 1.05x + 0.05R \qquad (5)$$

As described above, the semiconductor apparatus 10 according to the embodiment is configured such that with respect to the pairs of semiconductor devices 25, 26 and 27, 28 which are connected in parallel, the ratio of currents which flow through each pair falls in a certain range. That is, taking the first arm portion A as an example, the semiconductor apparatus 10 includes the insulation substrate 22, the conductive patterns which are provided on the main surface of the insulation substrate 22 and have the conductive pattern 24a and the conductive pattern 24c, and the semiconductor device 26 and the semiconductor device 25 which are each arranged on the conductive pattern 24a. The conductive pattern 24a includes the input region 24a2 which overlaps the semiconductor device 26 and the input region 24a4 which overlaps the semiconductor device 25. The semiconductor device 26 and the semiconductor device 25 respectively include the input electrodes 26d and 25d which are provided on the back surface opposed to the conductive pattern 24a and are electrically connected with the conductive pattern 24a, and the output electrodes 26b and 25b which are provided on the front surface on the opposite side to the back surface. The output electrode 26b of the semiconductor device 26 and the output electrode 25b of the semiconductor device 25 are connected with each other by the partial wire 29c2. The output electrode 25b of the semiconductor device 25 and the conductive pattern 24c are connected to each other by the partial wire 29$c$4. The ratio i2/i1 of the current i2, which flows from the input region 24$a$4 to the conductive pattern 24$c$ via the semiconductor device 25, relative to the current i1, which flows from the input region 24$a$2 to the conductive pattern 24$c$ via the semiconductor device 26, is equal to or greater than 0.90 and equal to or less than 1.10. Accordingly, the semiconductor apparatus 10 can reduce degradation of the wire joining portion due to non-uniformity of the currents flowing through the semiconductor devices 25 and 26 and can improve the power cycle tolerance, the short-circuit tolerance, the I²t tolerance, and so forth of the semiconductor devices 25 and 26. Furthermore, the semiconductor apparatus 10 can maintain long-term reliability.

The further preferable ratio i2/i1 of the current i2 relative to the current i1 is equal to or greater than 0.93 and equal to or less than 1.07, and the still further preferable ratio i2/i1 of the current i2 relative to the current i1 is equal to or greater than 0.95 and equal to or less than 1.05. Accordingly, the semiconductor apparatus 10 can make the currents flowing through the semiconductor devices 25 and 26 more uniform and can more reliably prevent degradation due to non-uniformity of the currents.

Furthermore, in the semiconductor apparatus according to the embodiment, the ratio R1/R2 of the resistance R1 of the path L1, which starts from the input region 24$a$2, passes through the semiconductor device 26 and the partial wire 29$c$2, and reaches the stitch point P4, relative to the resistance R2 of the path L2, which starts from the input region 24$a$4, passes through the semiconductor device 25, and reaches the stitch point P4 as the connection point between the output electrode 25$b$ of the semiconductor device 25 and the partial wire 29$c$4, may be equal to or greater than 0.90 and equal to or less than 1.10. Accordingly, the semiconductor apparatus 10 can reduce degradation of the wire joining portion due to non-uniformity of the currents flowing through the semiconductor devices 25 and 26 and can improve the power cycle tolerance, the short-circuit tolerance, the I²t tolerance, and so forth of the semiconductor devices 25 and 26. Furthermore, the semiconductor apparatus 10 can maintain long-term reliability.

A further preferable ratio R1/R2 of the resistance R1 relative to the resistance R2 is equal to or greater than 0.93 and equal to or less than 1.07, and a still further preferable ratio R1/R2 of the resistance R1 relative to the resistance R2 is equal to or greater than 0.95 and equal to or less than 1.05. Accordingly, the semiconductor apparatus 10 can make more uniform the currents flowing through the semiconductor devices 25 and 26 and can more certainly prevent degradation due to non-uniformity of the currents.

In order to cause the ratio i2/i1 or the ratio R1/R2 to fall in the above ranges, for example, the resistance Rc1 as the sum of the resistance of the solder layer 30B and the resistance of the semiconductor device 26 may be reduced. That is, in the semiconductor apparatus 10, the sum of (i) the resistance between the input electrode 26$d$ and the output electrode 26$b$ in the semiconductor device 26 and (ii) the resistance of the solder layer 30B which connects the semiconductor device 26 and the conductive pattern 24$a$ together may be less than the sum of (i) the resistance between the input electrode 25$d$ and the output electrode 25$b$ in the semiconductor device 25 and (ii) the resistance of the solder layer 30A which connects the semiconductor device 25 and the conductive pattern 24$a$ together. Accordingly, the resistance of the path L1 in which the resistance Rc1 is positioned becomes small, and the current i1 flowing through the path L1 can thereby be increased.

Furthermore, in order to cause the ratio i2/i1 or the ratio R1/R2 to fall in the above ranges, for example, the resistance Rw2 may be reduced which includes the resistance of the partial wire 29$c$2 (the first wiring member) connecting together the output electrode 26$b$ of the semiconductor device 26 and the output electrode 25$b$ of the semiconductor device 25. In this case, it is preferable that the resistance R2 is the same as the resistance Rp3 including the resistance of the intermediate region 24$a$3. That is, in the semiconductor apparatus 10, the resistance Rw2 of the partial wire 29$c$2 may be the same as the resistance Rp3 of the intermediate region 24$a$3 which is the region, of the conductive pattern 24$a$, between the input region 24$a$2 and the input region 24$a$4. Accordingly, the resistance of the path L1 in which the resistance Rw2 is positioned becomes small, and the current i1 flowing through the path L1 can thereby be increased.

Furthermore, in order to cause the ratio i2/i1 or the ratio R1/R2 to fall in the above ranges, for example, the resistance Rp3 as the resistance of the intermediate region 24$a$3 may be increased. Specifically, for example, as illustrated in FIG. 9, the trench T may be provided in which a part of the conductive pattern 24$a$ of the intermediate region 24$a$3 is removed. That is, in the semiconductor apparatus 10, the cross-sectional area of the intermediate region 24$a$3 which is the region, of the conductive pattern 24$a$, between the input region 24$a$2 and the input region 24$a$4 may be smaller than a cross-sectional area of the input region 24$a$2. In the intermediate region 24$a$3, the trench T may be provided in which a part of the conductive pattern 24$a$ is removed. Accordingly, the resistance of the path L2 in which resistance Rp3 is positioned becomes large, and the current i2 flowing through the path L2 can thereby be decreased.

Furthermore, in order to cause the ratio i2/i1 or the ratio R1/R2 to fall in the above ranges, for example, the resistance Rc2, which is the sum of the resistance of the solder layer 30A and the resistance of the semiconductor device 25, may be increased. That is, in the semiconductor apparatus 10, the sum of the resistance between the input electrode 25$d$ and the output electrode 25$b$ in the semiconductor device 25 and the resistance of the solder layer 30A which connects the semiconductor device 25 and the conductive pattern 24$a$ together may be greater than the sum of the resistance between the input electrode 26$d$ and the output electrode 26$b$ in the semiconductor device 26 and the resistance of the solder layer 30B which connects the semiconductor device 26 and the conductive pattern 24$a$ together. Accordingly, the resistance of the path L2 in which the resistance Rc2 is positioned becomes large, and the current i2 flowing through the path L2 can thereby be decreased.

Furthermore, in the present embodiment, because the semiconductor devices 25 to 28 are RC-IGBTs, an FWD does not have to be used. An area in the semiconductor apparatus 10 on which the semiconductor devices are mountable can be increased, and a large capacity of the semiconductor apparatus 10 can be realized.

It is to be noted that in the present embodiment, it is assumed that the semiconductor devices 25 to 28 are RC-IGBTs, but this is not restrictive, and the semiconductor devices 25 to 28 may be other switching elements such as an IGBT and a power MOSFET. Furthermore, as the semiconductor devices 25 to 28, diodes such as an SBD (Schottky Barrier Diode) and an FWD may be included as needed.

Furthermore, the number of semiconductor devices 25 to 28 of the semiconductor unit 20 is one example and is not limited to a case in which two semiconductor devices are arranged in each of the arm portions and the semiconductor unit 20 is configured with two arm portions. For example, three or more semiconductor devices may be arranged in each of the arm portions. In such a case also, ratios among currents which flow via the semiconductor devices are set to values which are equal to or greater than 0.90 and equal to or less than 1.10. Furthermore, for example, as the semiconductor devices, an IGBT chip and an FWD chip may be simultaneously arranged in each of the arm portions. In such a case also, IGBT chips are arranged such that gate electrodes are arrayed in one line while the gate electrodes are directed to one side that is parallel with an array of the IGBT chips. FWD chips may be arranged in another line in parallel with the line of the IGBT chips or may be arranged in the same line as the IGBT chips. Furthermore, for example, the semiconductor unit 20 may be configured with three or more arm portions. In such a case, three or more arm portions are arranged to be aligned vertically to an array of the semiconductor devices.

DESCRIPTION OF REFERENCE SIGNS 10 semiconductor apparatus
20 (20a to 20f) semiconductor unit
22 insulation substrate
24 (24a to 24e) conductive pattern
24a1 contact region
24a2 input region
24a3 intermediate region
24a4 input region
24b1 connection region
24c1 first region
24c2 second region
24c3 connection region
24c4 contact region
24d1 connection region
24e1 connection region
24e2 contact region
25 to 28 semiconductor device
25a to 28a gate electrode
25b to 28b output electrode (emitter electrode)
25c to 28c gate runner
26d, 25d input electrode (collector electrode)
29 (29a to 29d) bonding wire
29cx, 29dx single-bonding wire
30 (30A, 30B) solder layer
A first arm portion
B second arm portion
What is claimed is:
1. A semiconductor apparatus comprising:
a conductive pattern having a first conductive pattern and a second conductive pattern; and
a first semiconductor device and a second semiconductor device each arranged on the first conductive pattern, wherein:
the first conductive pattern includes a first input region overlapping the first semiconductor device and a second input region overlapping the second semiconductor device, each of the first semiconductor device and the second semiconductor device includes:
a first main electrode that is provided on a first main surface opposed to the first conductive pattern and is electrically connected with the first conductive pattern; and
a second main electrode that is provided on a second main surface on an opposite side to the first main surface,
the second main electrode of the first semiconductor device and the second main electrode of the second semiconductor device are connected with each other by a first wiring member formed with a wire or a ribbon cable,
the second main electrode of the second semiconductor device and the second conductive pattern are connected with each other by a second wiring member formed with the wire or the ribbon cable,
a ratio (i2/i1) of a current (i2) flowing from the second input region to the second conductive pattern via the second semiconductor device, relative to a current (i1) flowing from the first input region to the second conductive pattern via the first semiconductor device, is equal to or greater than 0.90 and equal to or less than 1.10, and
a resistivity of the first wiring member is higher than a resistivity of the first conductive pattern.
2. The semiconductor apparatus according to claim 1, wherein the ratio (i2/i1) of the current (i2) relative to the current (i1) is equal to or greater than 0.93 and equal to or less than 1.07.
3. The semiconductor apparatus according to claim 1, wherein the ratio (i2/i1) of the current (i2) relative to the current (i1) is equal to or greater than 0.95 and equal to or less than 1.05.
4. The semiconductor apparatus according to claim 1, wherein a sum of a resistance between the first main electrode and the second main electrode in the first semiconductor device and a resistance of a connection layer between the first semiconductor device and the first conductive pattern is less than a sum of a resistance between the first main electrode and the second main electrode in the second semiconductor device and a resistance of a connection layer between the second semiconductor device and the first conductive pattern.
5. The semiconductor apparatus according to claim 1, wherein:
the first conductive pattern includes an intermediate region between the first input region and the second input region, and
a resistance of the first wiring member is the same as a resistance of the intermediate region.
6. The semiconductor apparatus according to claim 1, wherein:
the first conductive pattern includes an intermediate region between the first input region and the second input region, and
a cross-sectional area of the intermediate region is smaller than a cross-sectional area of the first input region.
7. The semiconductor apparatus according to claim 6, wherein a trench in which a part of the first conductive pattern is removed is provided in the intermediate region.
8. The semiconductor apparatus according to claim 1, wherein the first wiring member and the second wiring member are formed with a single wire or a single ribbon cable stitch bonded to the second main electrode of the first semiconductor device, to the second main electrode of the second semiconductor device, and to the second conductive pattern.
9. The semiconductor apparatus according to claim 8, wherein in addition to the single wire or the single ribbon cable, which is the first wiring member and the second wiring member, a third wiring member formed with a wire or a ribbon cable connecting together the second main electrode of the second semiconductor device and the second conductive pattern is provided.

10. The semiconductor apparatus according to claim 1, wherein:

the second semiconductor device is arranged at an interval from the second conductive pattern along a first axis, the first semiconductor device is arranged at an interval from the second semiconductor device along the first axis, and the first wiring member and the second wiring member extend along the first axis.

11. The semiconductor apparatus according to claim 10, wherein:

each of the first semiconductor device and the second semiconductor device presents, in plan view, a rectangular shape which has a pair of long sides opposed to each other and a pair of short sides opposed to each other, and is arranged on the first conductive pattern such that the short sides extend along the first axis.

12. The semiconductor apparatus according to claim 11, wherein:

each of the second main surface of the first semiconductor device and the second main surface of the second semiconductor device is provided with:

a gate electrode; and a gate runner electrically connected with the gate electrode, and the gate runner is arranged in parallel with the long sides of the second main surface.

13. The semiconductor apparatus according to claim 1, wherein each of the first semiconductor device and the second semiconductor device is a reverse conducting insulated gate bipolar transistor (RC-IGBT).

14. A semiconductor apparatus comprising:

a conductive pattern having a first conductive pattern and a second conductive pattern; and a first semiconductor device and a second semiconductor device each arranged on the first conductive pattern, wherein:

the first conductive pattern includes a first input region overlapping the first semiconductor device and a second input region overlapping the second semiconductor device, each of the first semiconductor device and the second semiconductor device includes:

a first main electrode that is provided on a first main surface opposed to the first conductive pattern and is electrically connected with the first conductive pattern; and a second main electrode that is provided on a second main surface on an opposite side to the first main surface, the second main electrode of the first semiconductor device and the second main electrode of the second semiconductor device are connected with each other by a first wiring member formed with a wire or a ribbon cable, the second main electrode of the second semiconductor device and the second conductive pattern are connected with each other by a second wiring member formed with the wire or the ribbon cable, a ratio (R1/R2) of a resistance (R1) of a first path relative to a resistance (R2) of a second path is equal to or greater than 0.90 and equal to or less than 1.10, the first path starting from the first input region and reaching a connection point between the second main electrode of the second semiconductor device and the second wiring member while passing through the first semiconductor device and the first wiring member, and the second path starting from the second input region and reaching the connection point between the second main electrode of the second semiconductor device and the second wiring member while passing through the second semiconductor device, and a resistivity of the first wiring member is higher than a resistivity of the first conductive pattern.

15. The semiconductor apparatus according to claim 14, wherein the ratio (R1/R2) of the resistance (R1) relative to the resistance (R2) is equal to or greater than 0.93 and equal to or less than 1.07.

16. The semiconductor apparatus according to claim 14, wherein the ratio (R1/R2) of the resistance (R1) relative to the resistance (R2) is equal to or greater than 0.95 and equal to or less than 1.05.

17. The semiconductor apparatus according to claim 14, wherein the first wiring member and the second wiring member are formed with a single wire or a single ribbon cable stitch bonded to the second main electrode of the first semiconductor device, to the second main electrode of the second semiconductor device, and to the second conductive pattern.

18. The semiconductor apparatus according to claim 17, wherein in addition to the single wire or the single ribbon cable, which is the first wiring member and the second wiring member, a third wiring member formed with a wire or a ribbon cable connecting together the second main electrode of the second semiconductor device and the second conductive pattern is provided.

19. The semiconductor apparatus according to claim 14, wherein:

the second semiconductor device is arranged at an interval from the second conductive pattern along a first axis, the first semiconductor device is arranged at an interval from the second semiconductor device along the first axis, and the first wiring member and the second wiring member extend along the first axis.

20. The semiconductor apparatus according to claim 19, wherein:

each of the first semiconductor device and the second semiconductor device presents, in plan view, a rectangular shape which has a pair of long sides opposed to each other and a pair of short sides opposed to each other, and is arranged on the first conductive pattern such that the short sides extend along the first axis.

21. The semiconductor apparatus according to claim 20, wherein:

each of the second main surface of the first semiconductor device and the second main surface of the second semiconductor device is provided with:

a gate electrode; and a gate runner electrically connected with the gate electrode, and the gate runner is arranged in parallel with the long sides of the second main surface.

22. The semiconductor apparatus according to claim 14, wherein each of the first semiconductor device and the second semiconductor device is a reverse conducting insulated gate bipolar transistor (RC-IGBT).

* * * * *